US011636905B2

(12) United States Patent
Puthenthermadam et al.

(10) Patent No.: US 11,636,905 B2
(45) Date of Patent: Apr. 25, 2023

(54) TEMPERATURE COMPENSATION FOR UNSELECTED SUB-BLOCK INHIBIT BIAS FOR MITIGATING ERASE DISTURB

(71) Applicant: SanDisk Technologies LLC, Addison, TX (US)

(72) Inventors: Sarath Puthenthermadam, San Jose, CA (US); Huai-yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/113,920

(22) Filed: Dec. 7, 2020

(65) Prior Publication Data
US 2022/0180948 A1    Jun. 9, 2022

(51) Int. Cl.
| G11C 16/16 | (2006.01) |
| G11C 16/34 | (2006.01) |
| G11C 11/56 | (2006.01) |
| G11C 16/04 | (2006.01) |
| H01L 27/11582 | (2017.01) |
| H01L 27/11556 | (2017.01) |

(52) U.S. Cl.
CPC ...... *G11C 16/3418* (2013.01); *G11C 11/5635* (2013.01); *G11C 11/5671* (2013.01); *G11C 16/0483* (2013.01); *G11C 16/16* (2013.01); *G11C 16/3445* (2013.01); *H01L 27/11556* (2013.01); *H01L 27/11582* (2013.01)

(58) Field of Classification Search
CPC .................................................. G11C 16/3418
See application file for complete search history.

(56) References Cited

U.S. PATENT DOCUMENTS

| 6,272,047 B1 * | 8/2001 | Mihnea ................. G11C 16/12 365/185.14 |
| 7,023,736 B2 | 4/2006 | Cernea et al. |
| 7,046,568 B2 | 5/2006 | Cernea |
| 7,196,928 B2 | 3/2007 | Chen |
| 7,196,931 B2 | 3/2007 | Cernea et al. |
| 7,327,619 B2 | 2/2008 | Chan et al. |

(Continued)

FOREIGN PATENT DOCUMENTS

| KR | 20130037555 A | 4/2013 |
| KR | 1020150014456 A | 2/2015 |

*Primary Examiner* — Min Huang
(74) *Attorney, Agent, or Firm* — Dickinson Wright PLLC; Steven C. Hurles

(57) ABSTRACT

A memory apparatus and method of operation is provided. The apparatus includes a block having memory cells connected to word lines and arranged in strings and is divided into a first sub-block and a second sub-block each configured to be erased as a whole in an erase operation. The apparatus has a temperature measuring circuit configured to detect an ambient temperature of the apparatus. A control circuit is configured to determine a word line inhibit voltage based on the ambient temperature. The control circuit applies an erase voltage to each of the strings while simultaneously applying a word line erase voltage to the word lines associated with a selected one of the first and second sub-blocks to encourage erasing and the word line inhibit voltage to the word lines associated with an unselected one of the first and second sub-blocks to discourage erasing in the erase operation.

14 Claims, 19 Drawing Sheets

(56) References Cited

U.S. PATENT DOCUMENTS

| | | | |
|---|---|---|---|
| 8,649,219 B2 | 2/2014 | Li et al. | |
| 8,787,088 B2 | 7/2014 | Dutta et al. | |
| 8,861,280 B2 | 10/2014 | Costa et al. | |
| 8,909,493 B2 | 12/2014 | Avila et al. | |
| 9,214,240 B2 | 12/2015 | Dutta et al. | |
| 9,396,808 B2 | 7/2016 | Dutta et al. | |
| 9,852,800 B2 * | 12/2017 | Lang et al. | |
| 2006/0200619 A1 * | 9/2006 | Kunori | G11C 11/5642 711/103 |
| 2006/0279990 A1 * | 12/2006 | Wan | G11C 16/3418 365/185.17 |
| 2013/0007353 A1 * | 1/2013 | Shim | H01L 29/7926 711/E12.008 |
| 2014/0085982 A1 * | 3/2014 | Asaoka | G11C 16/16 365/185.17 |
| 2014/0269111 A1 * | 9/2014 | He | G11C 7/04 365/189.011 |

\* cited by examiner

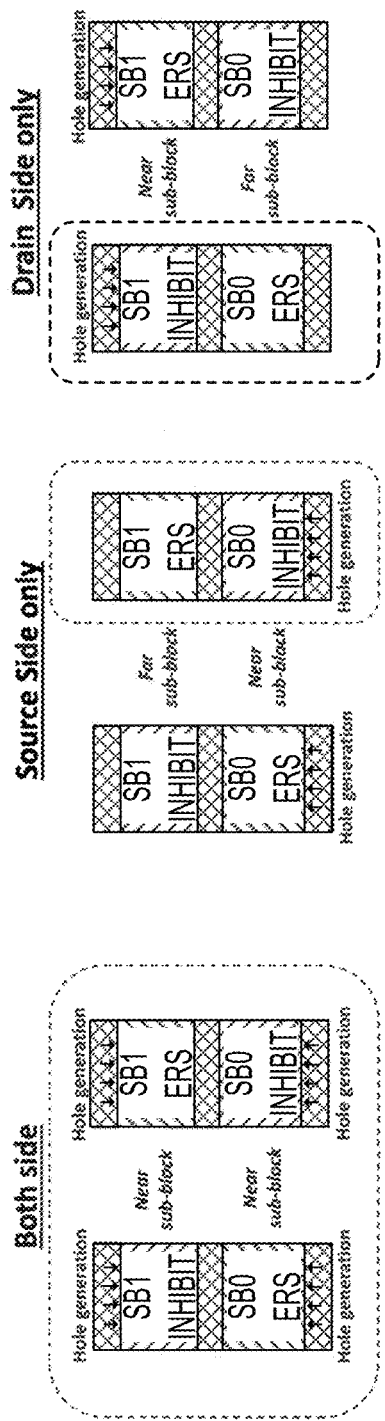

TEMPERATURE COMPENSATION FOR UNSELECTED SUB-BLOCK INHIBIT BIAS FOR MITIGATING ERASE DISTURB

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory utilizes a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some non-volatile memory utilizes a charge trapping layer to store information. One such example has an oxide-nitride-oxide (ONO) region, in which the nitride (e.g., SiN) serves as a charge trapping layer to store information. When such a memory cell is programmed, electrons are stored in the charge trapping layer.

Non-volatile memory could have a 2D architecture or a 3D architecture. Ultra high density storage devices have been employed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. The conductor layers may function as word lines. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A back gate may surround the pipe connection to control conduction of the pipe connection. Control gates of the memory cells are provided by the conductor layers.

Prior to programming certain non-volatile memory devices, such as a NAND flash memory device, the memory cells are typically erased. The erase operation removes electrons from the floating gate, for some devices. For other devices, the erase operation removes electrons from the charge trapping layer.

During operation of the non-volatile memory device, the reading, writing, and erase of data in one storage unit or memory cell will often disturb the data stored in other storage units of the memory. One source of these disturbs is the field effect coupling between adjacent floating gates.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including a block having memory cells connected to word lines and arranged in strings. The block is divided into a first sub-block and a second sub-block each configured to be erased as a whole in an erase operation. The apparatus also includes a temperature measuring circuit configured to detect an ambient temperature of the apparatus. A control circuit is coupled to the word lines and the strings and the temperature measuring circuit and is configured to determine a word line inhibit voltage based on the ambient temperature. The control circuit is also configured to apply an erase voltage to each of the strings while simultaneously applying a word line erase voltage to the word lines associated with a selected one of the first and second sub-blocks to encourage erasing of the memory cells in the erase operation. In addition, the control circuit is configured to apply the word line inhibit voltage to the word lines associated with an unselected one of the first and second sub-blocks to discourage erasing of the memory cells in the erase operation.

According to another aspect of the disclosure a controller in communication with a memory apparatus including a block having memory cells connected to word lines and arranged in strings. The block is divided into a first sub-block and a second sub-block each configured to be erased as a whole in an erase operation. The controller is in communication with a temperature measuring circuit configured to detect an ambient temperature of the memory apparatus. The controller is configured to determine a word line inhibit voltage based on the ambient temperature. The controller is also configured to instruct the memory apparatus to apply an erase voltage to each of the strings while simultaneously applying a word line erase voltage to the word lines associated with a selected one of the first and second sub-blocks to encourage erasing of the memory cells in the erase operation. Additionally, the controller is configured to instruct the memory apparatus to apply and the word line inhibit voltage to the word lines associated with an unselected one of the first and second sub-blocks to discourage erasing of the memory cells in the erase operation.

According to an additional aspect of the disclosure a method of operating a memory apparatus is provided. The memory apparatus includes a block having memory cells connected to word lines and arranged in strings. The block is divided into a first sub-block and a second sub-block each configured to be erased as a whole in an erase operation. The memory apparatus also includes a temperature measuring circuit configured to detect an ambient temperature of the memory apparatus. The method includes the step of determining a word line inhibit voltage based on the ambient temperature. The method continues with the step of applying an erase voltage to each of the strings while simultaneously applying a word line erase voltage to the word lines associated with a selected one of the first and second sub-blocks to encourage erasing of the memory cells and the word line inhibit voltage to the word lines associated with an unselected one of the first and second sub-blocks to discourage erasing of the memory cells in the erase operation.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 10A-10C show that gate-induced drain leakage (GIDL) based hole generation can blocked during two-sided, source side, and drain side erase operations according to aspects of the disclosure;

Figure 12:
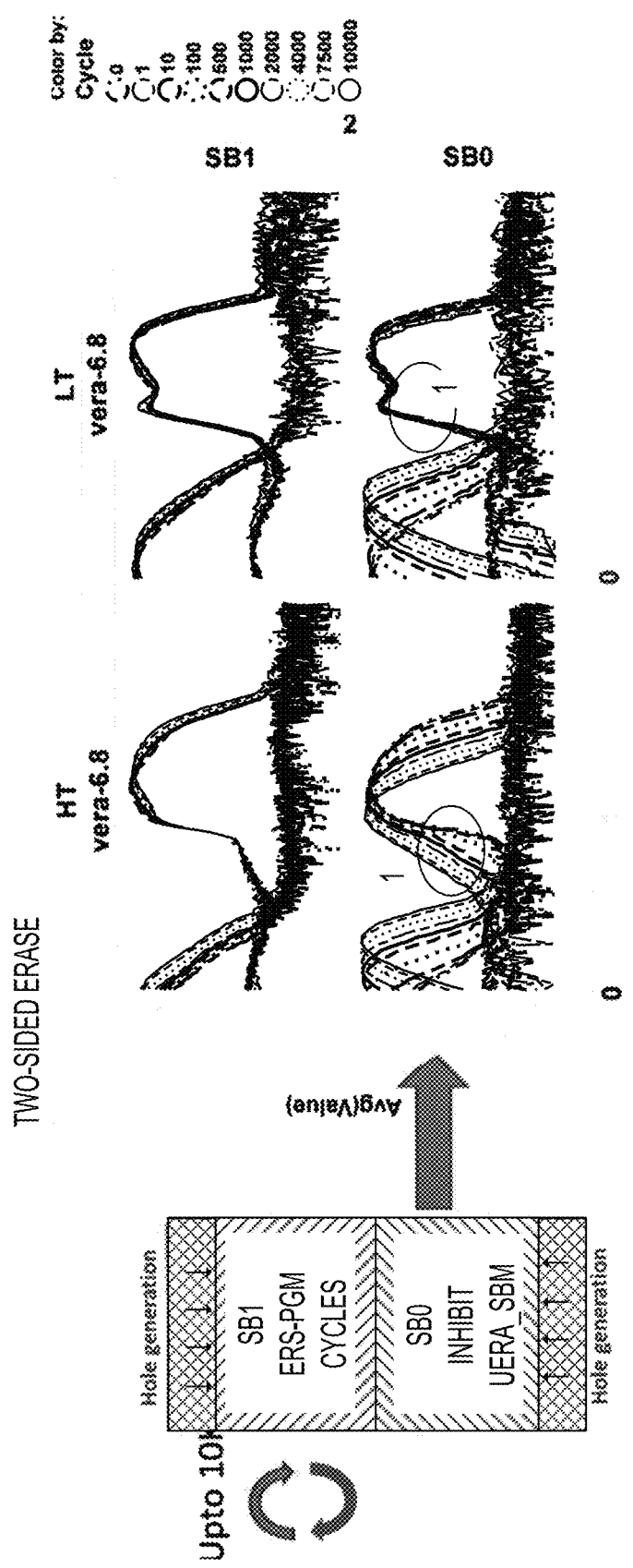
Figures 13A, 13B:
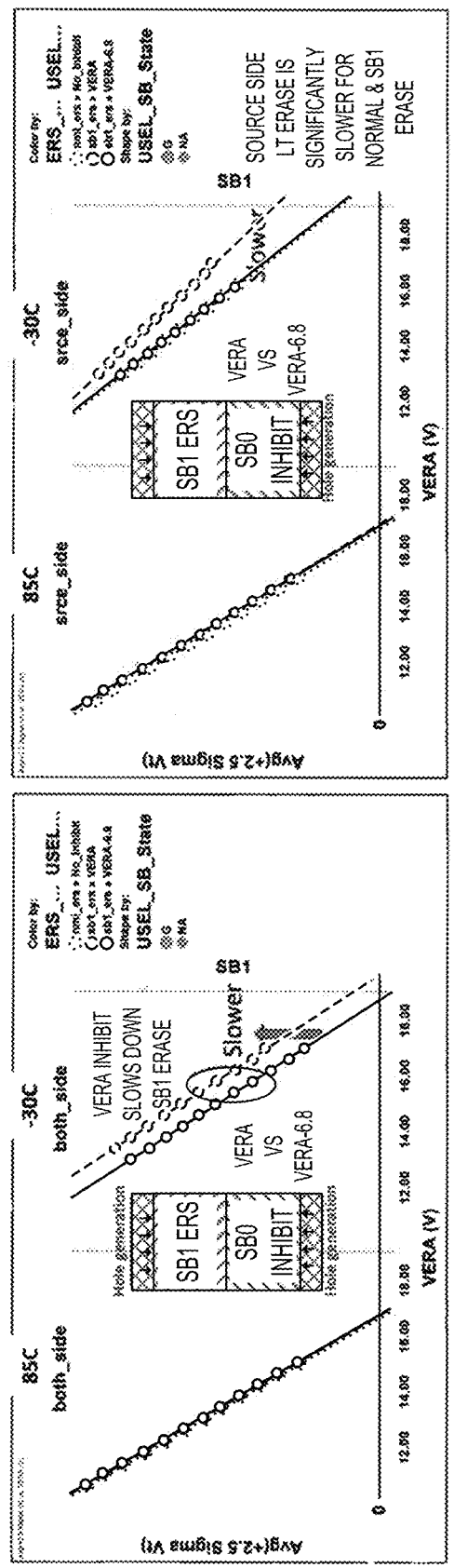
Figure 14B:
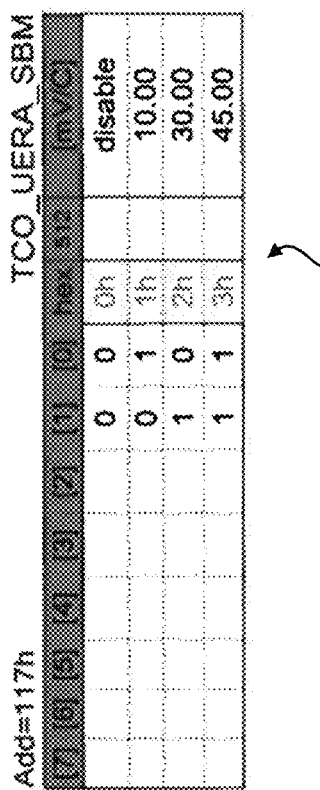
Figure 14A:
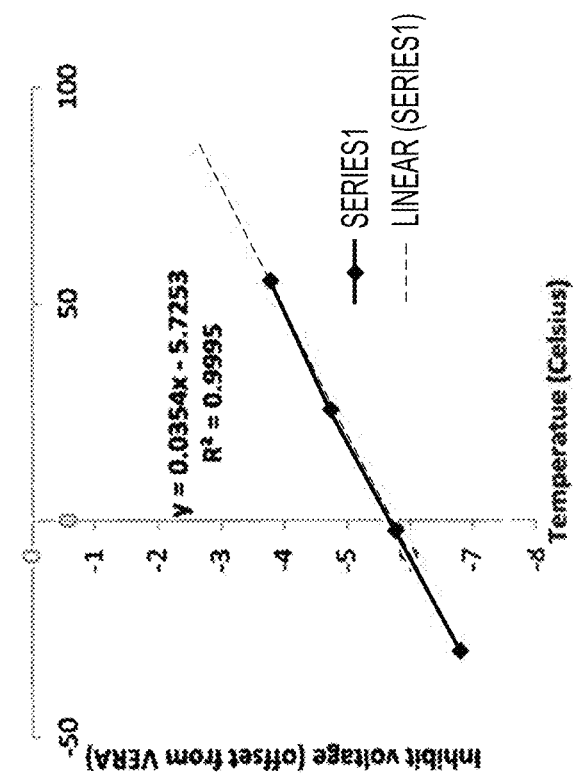
Figure 15:
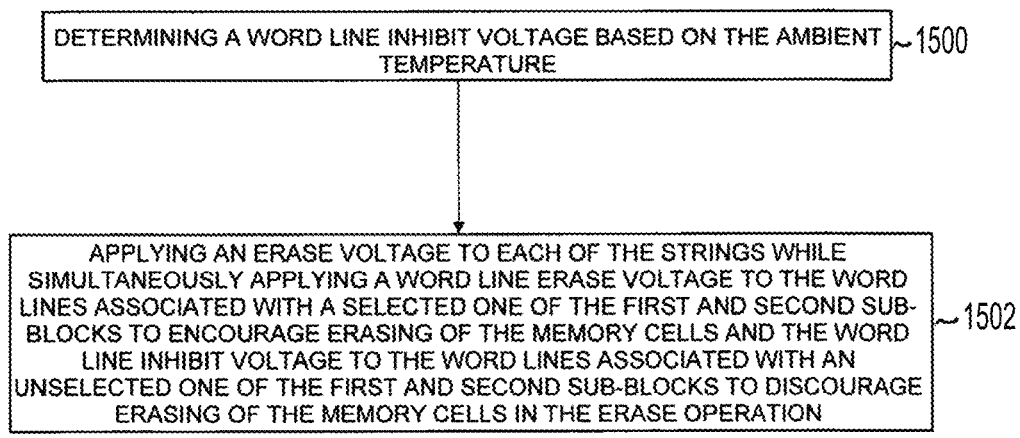
Figure 16:
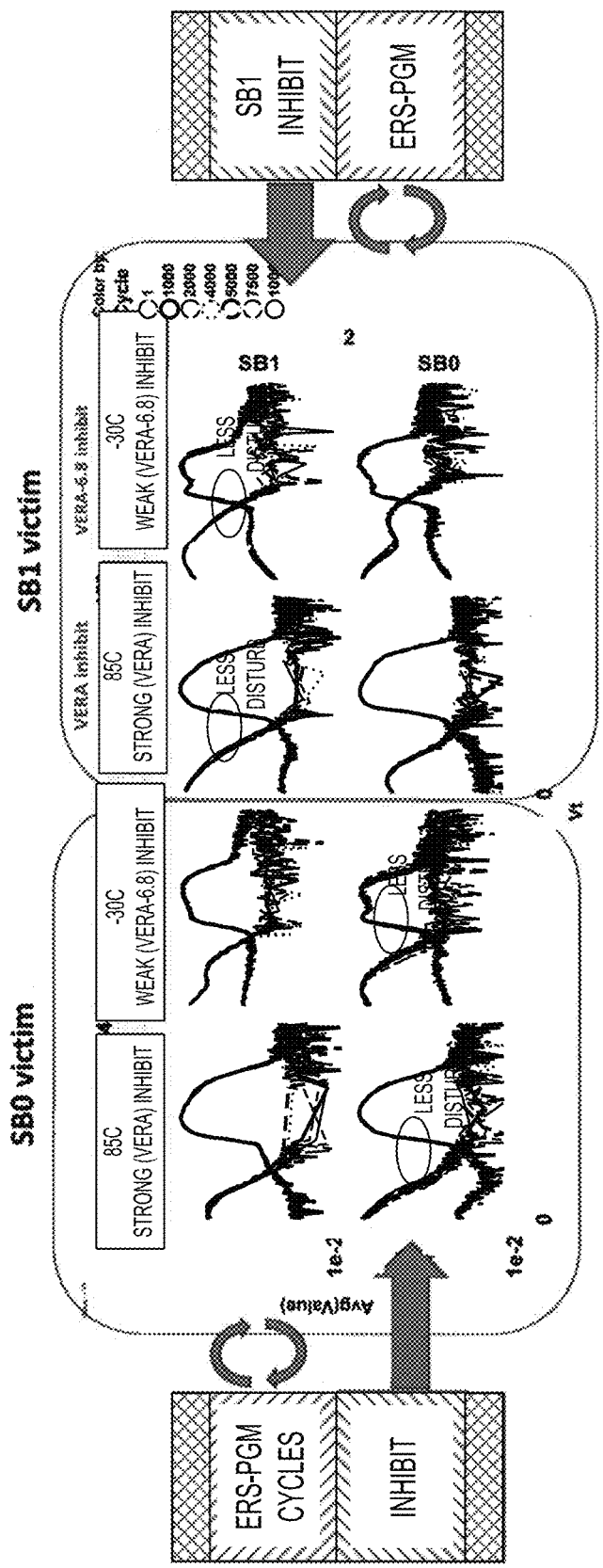

FIG. 11 illustrates that when the inhibited or unselected sub-blocks are strongly inhibited, the erase speed of the selected sub-block is reduced, while there is less erase disturb on the unselected or inhibited sub-block and when the inhibited or unselected sub-blocks are weakly inhibited, the erase speed of the selected sub-block is improved, while there is more or worse erase disturb on the unselected or inhibited sub-block according to aspects of the disclosure;

FIG. 12 shows erase disturb of the unselected sub-block during a two-sided erase operation at both a high temperature and a low temperature according to aspects of the disclosure;

FIGS. 13A and 13B illustrate comparisons of an erase upper tail to demonstrate the erase speed of the selected sub-block during a two-sided erase and a source side erase operation at both the high temperature and the low temperature according to aspects of the disclosure;

FIG. 14A shows a plot of the word line inhibit voltage at various temperatures for negligible erase disturb for an example memory apparatus according to aspects of the disclosure;

FIG. 14B shows a table stored in the memory cells configured to store one or more factors used to determine the word line inhibit voltage based on the ambient temperature according to aspects of the disclosure;

FIG. 15 illustrates steps of a method of operating the memory apparatus according to aspects of the disclosure; and FIG. 16 shows simulated results of the memory apparatus in which the word line inhibit voltage is selected based on the ambient temperature according to aspects of the disclosure.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 8A). In a three-bit per cell memory device, there are eight data states including the erased state and seven higher data states referred to as the A, B, C, D, E, F and G data states. In a four-bit per cell memory device, there are sixteen data states including the erased state and fifteen higher data states.

Before programming certain non-volatile memory devices, the memory cells are typically erased. For some devices, the erase operation removes electrons from the floating gate of the memory cell being erased. Alternatively, the erase operation removes electrons from the charge trapping layer. Memory cells not being erased are usually inhibited from erasing.

When sub-blocks are arranged vertically in a stack (e.g., one or more sub-blocks arranged vertically on top of another sub-block), erasing one sub-block can cause erase disturb in another sub-block that is inhibited from erasing. In addition, during the erase operation, the holes necessary for erasing one sub-block (e.g., gate-induced drain leakage (GIDL) based hole generation or holes supplied by a PWELL instead of GIDL based hole generation) can be blocked by the sub-block that is inhibited from erasing. As a result, when the inhibited or unselected sub-blocks are strongly inhibited, the erase speed of the selected sub-block (the one being erased) is reduced; however, there is typically less erase disturb on the unselected or inhibited sub-block. In contrast, when the inhibited or unselected sub-blocks are weakly inhibited, the erase speed of the selected sub-block (the one being erased) is improved, while there is more or worse erase disturb on the unselected or inhibited sub-block. These effects may also be impacted by the temperature of the memory cells.

Figure 1A:
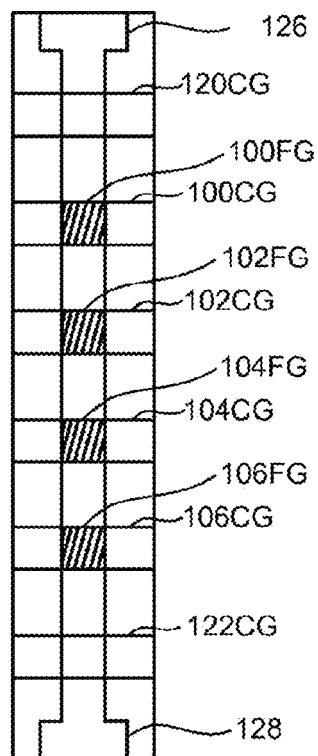
FIG. 1A is a top view of a NAND string according to aspects of the disclosure.
Figure 1B:
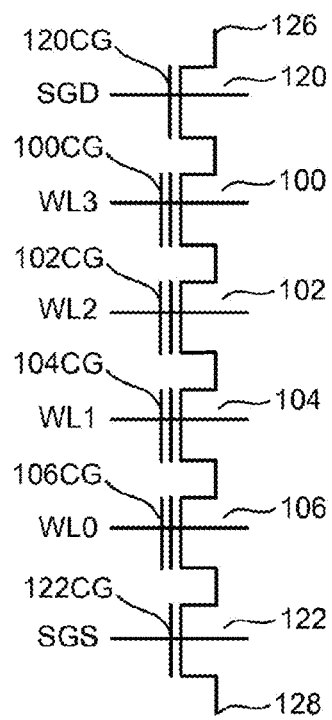
FIG. 1B is an equivalent circuit diagram of the NAND string of FIG. 1A according to aspects of the disclosure.

Techniques disclosed herein may be applied to 3D NAND, but are not necessarily limited thereto. A NAND flash memory structure may arrange multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
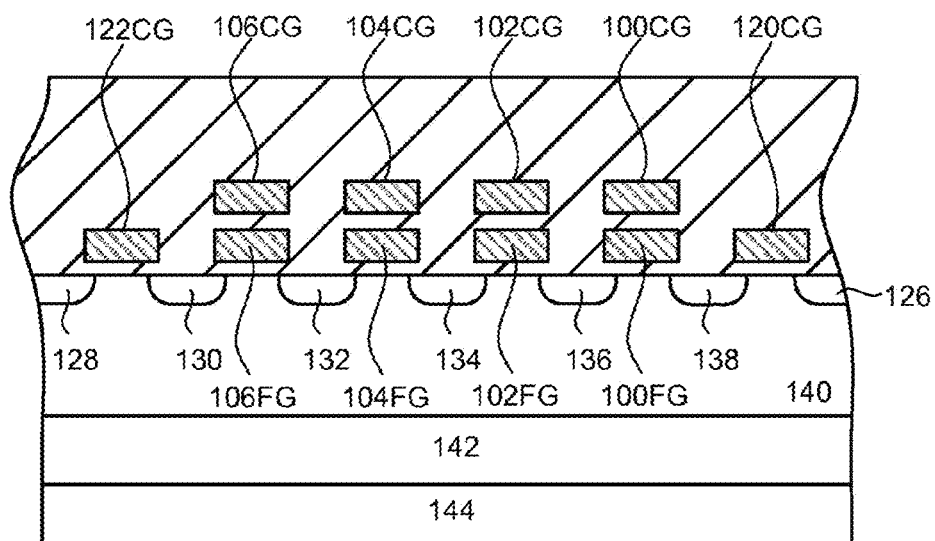
FIG. 2 is a cross-sectional view of the NAND string of FIG. 1A according to aspects of the disclosure.

FIG. 2 provides a cross-sectional view of one embodiment of the NAND string described above. FIG. 2 is for a 2D NAND string formed in a substrate. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1A-2 show four memory cells in the NAND string, the use of four transistors is provided only as an example. A NAND string used with the technology described herein can have less than four memory cells or more than four memory cells. For example, some NAND strings will include 8, 16, 32, 64 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0V to the control gate, the memory cell will turn on to indicate logic one is being stored. When the threshold voltage is positive and a read operation is attempted by applying 0V to the control gate, the memory cell will not turn on, which indicates that logic zero is stored.

A memory cell can also store multiple states, thereby storing multiple bits of digital data. When storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
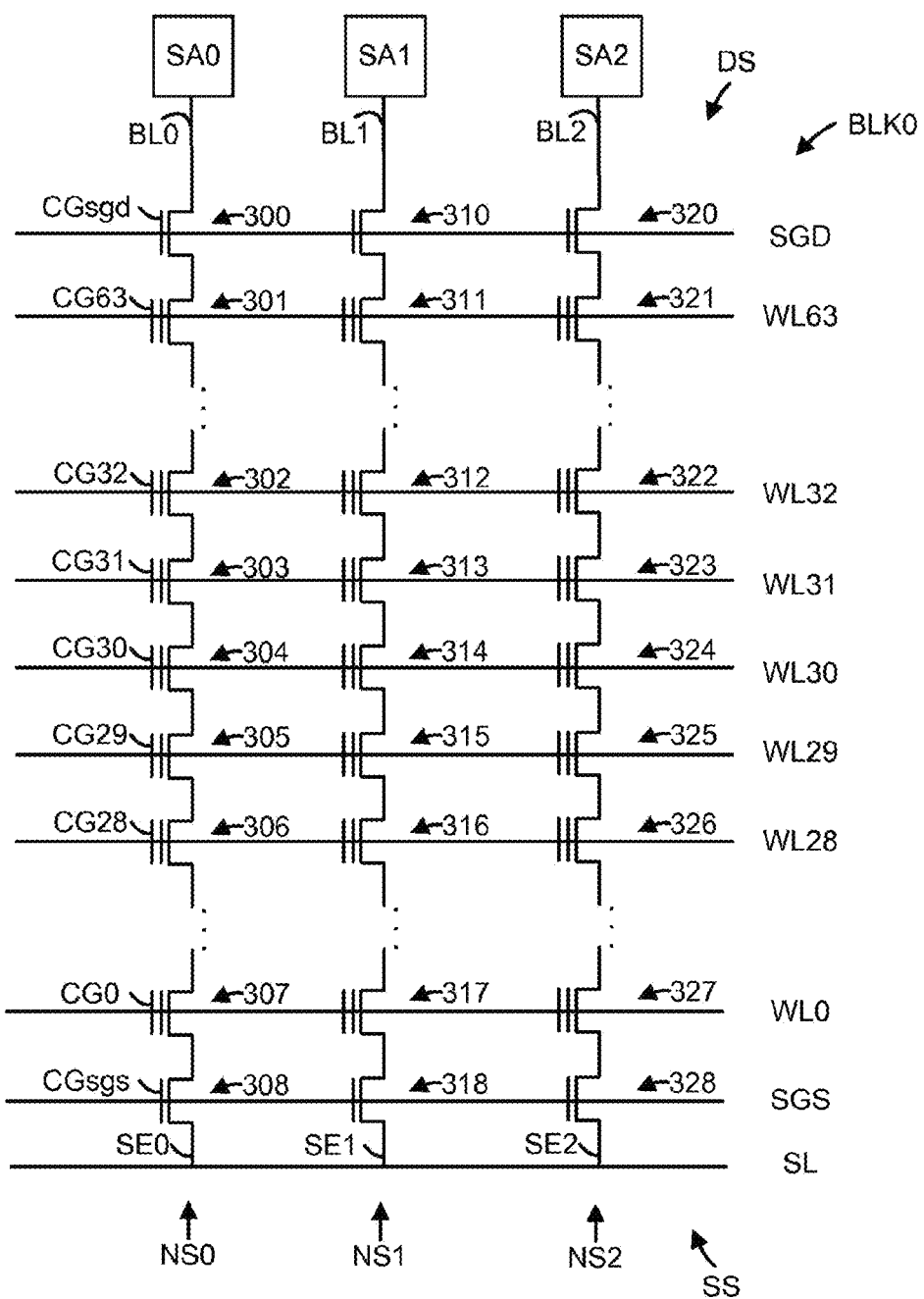
FIG. 3 depicts three example NAND strings such as shown in FIGS. 1A-2 in a block BLK0 according to aspects of the disclosure.

FIG. 3 depicts three example NAND strings such as shown in FIGS. 1A-2 in a block BLK0. BLK0 includes a number of NAND strings NS0, NS1, NS2, ... and respective bit lines, e.g., BL0, BL1, BL2 ... in communication with respective sense amplifiers SA0, SA1, SA2, ... BLK0 comprises a set of non-volatile storage elements. Each NAND string is connected at one end to a select gate, drain (SGD) transistor, and the control gates of the SGD transistors are connected via a common SGD line. The NAND strings are connected at their other end to a select gate, source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

An example NAND string NS0 includes storage elements 301, ..., 302-306, ..., 307 with respective control gates CG63, ... CG32-CG28, ... CG0, an SGS transistor 308 with a control gate CGsgs and a SGD transistor 300 with a control gate CGsgd. Another example NAND string NS1 includes storage elements 311, ..., 312-316, ..., 317, an SGS transistor 318 and a SGD transistor 310. Another example NAND string NS2 includes storage elements 321, ..., 322-326, ..., 327, an SGS transistor 328 and a SGD transistor 320. The NAND strings NS0, NS2, ... are even numbered, and the NAND strings NS1, NS3 (not shown), ... are odd numbered. Similarly, the bit lines BL0, BL2, ... are even numbered, and the NAND strings BL1, BL3 (not shown), ... are odd numbered. The storage elements can store user data and/or non-user data.

Figure 4:
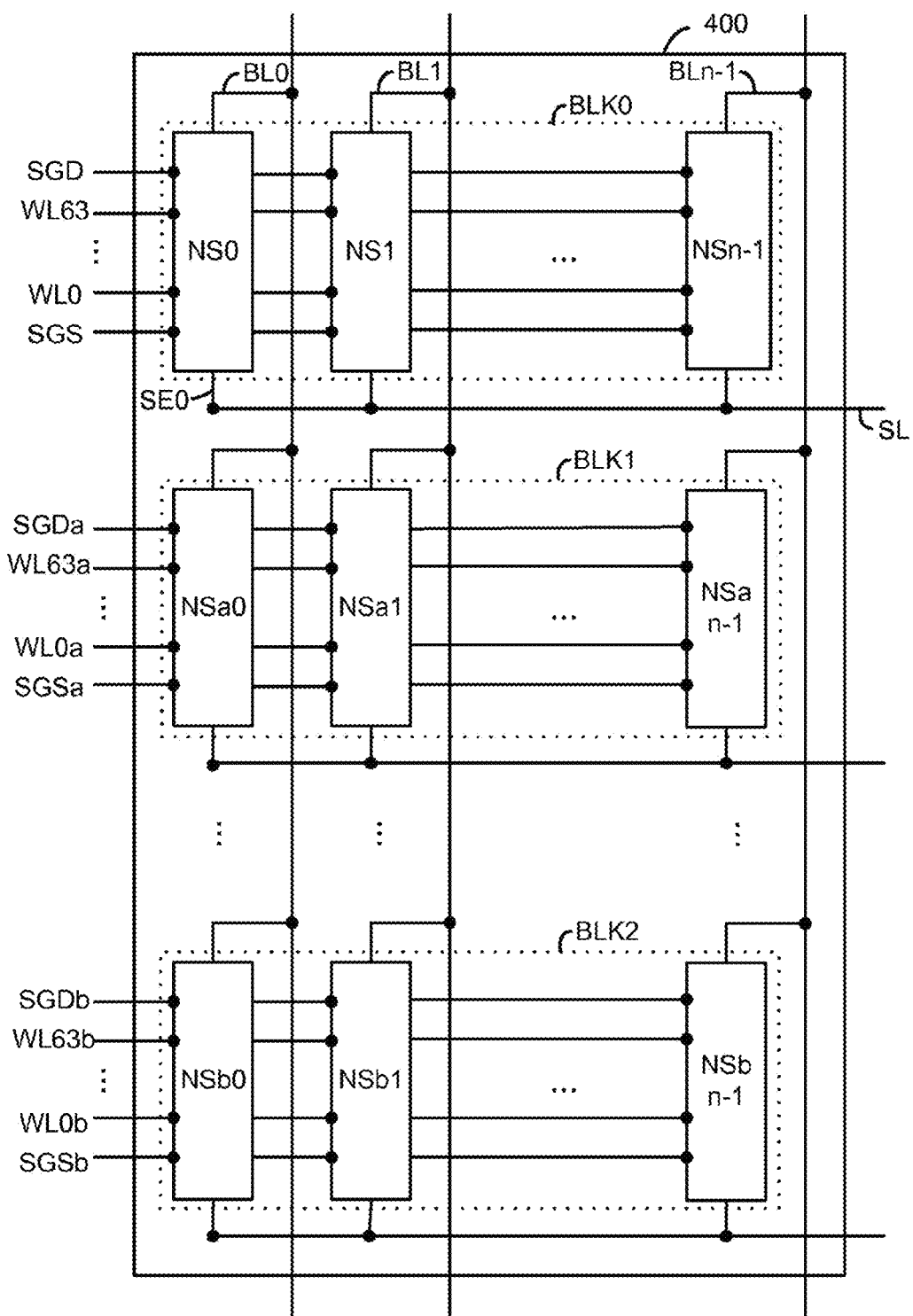
FIG. 4 is a block diagram of an array 400 of NAND flash memory cells including BLK0 of FIG. 3 and additional blocks BLK1 and BLK2 according to aspects of the disclosure.

FIG. 4 is a block diagram of an array 400 of NAND flash memory cells including BLK0 of FIG. 3 and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of storage elements is divided into a large number of blocks (e.g., BLK0-BLK2) of storage elements, where each block includes a set of one or more NAND strings in communication with a common set of word lines, SGS line and SGD line. Each NAND string is also in communication with a respective bit line. For example, BLK0 includes NAND strings NS0, NS1, ..., NSn-1 in communication with BL0, BL1, ... BLn-1, respectively, and with WL0-WL63 SGS and SGD. BLK1 includes NAND strings NSa0, NSa1, ..., NSan-1 in communication with BL0, BL1, ... BLn-1, respectively, and with WL0 a-WL63 a, SGSa and SGDa. BLK2 includes NAND strings NSb0, NSb1, ..., NSbn-1 in communication with BL0, BL1, ... BLn-1, respectively, and with WL0 b-WL63 b, SGSb and SGDb.

As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 15-20 V) for a sufficient period of time and grounding or applying a low bias, e.g., 1

V, on the word lines of a selected block while the source and bit lines are floating. Due to capacitive cross coupling ("cross" denotes coupling from neighboring storage elements), the bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells. In one embodiment, 3D NAND is erased using a different technique. 3D NAND will be further discussed below.

Figure 5A:
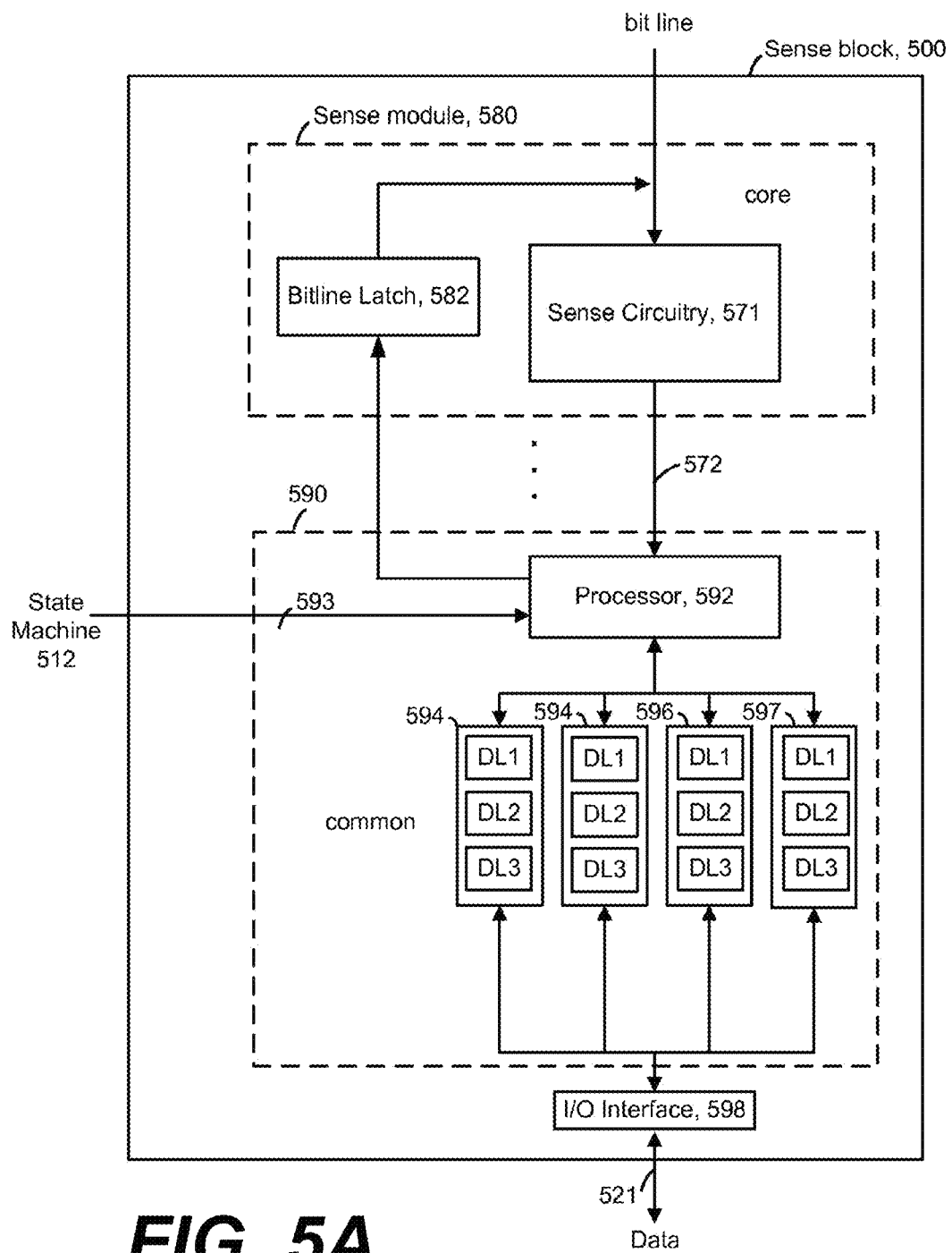
FIG. 5A is a block diagram depicting one embodiment of a sense block according to aspects of the disclosure.

FIG. 5A is a block diagram depicting one embodiment of a sense block 500. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block 500 will include one common portion 590 and eight sense modules 580. Each of the sense modules in a group will communicate with the associated common portion via a data bus 572.

Sense module 580 comprises sense circuitry 571 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V). As an example, a flag=0 can inhibit programming, while flag=1 does not inhibit programming.

Common portion 590 comprises a processor 592, three example sets of data latches 594 and an I/O Interface 598 coupled between the sets of data latches 594 and data bus 521. One set of data latches can be provided for each sense module, and three data latches identified by DL1, DL2, and DL3 may be provided for each set. The use of the data latches is further discussed below.

Processor 592 performs computations. For example, one of its functions is to determine the data stored in the sensed storage element and store the determined data in the set of data latches. At least some of the data latches in a set of data latches (e.g., 594) are used to store data bits determined by processor 592 during a read operation. At least some of the data latches in a set of data latches are also used to store data bits imported from the data bus 521 during a program operation. The imported data bits represent write data meant to be programmed into the memory. I/O interface 598 provides an interface between data latches 594-697 and the data bus 521.

In one embodiment, data is stored in the DL1 and DL2 latches at the beginning of the program operation. For example, lower page data may be stored in DL1 and upper page data may be stored in DL2. In one embodiment, lower page data that is read from memory cells during an IDL is stored in the DL1 latches. DL3 may be used to store verify status, such as lockout status during programming. For example, when a memory cell's Vt has been verified a reaching its target level, the DL3 latch can be set to indicate this such that further programming of the memory cell may be inhibited. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 512 controls the supply of different control gate voltages to the addressed storage element. As it steps through the various control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches (e.g., 594). In another embodiment of the core portion, bit line latch 582 serves both as a latch for latching the output of the sense module 580 and as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594-597 from the data bus 521. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Each set of data latch stacks 594-597 contains a stack of data latches corresponding to the sense module 580, in one embodiment. In one embodiment, there are three data latches per sense module 580. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 5A) for initially storing the third bit of data that is to be programmed into a storage element. In one embodiment, the storage elements four bits per storage element, in which there may be two additional data latches (not depicted in FIG. 5A) for initially storing the third and fourth bits of data that is to be programmed into a storage element. The storage elements could store more than four bits per storage element, in which case there may be one data latch for each bit.

Additional information about the read operations and sense amplifiers can be found in (1) U.S. Pat. No. 7,196,931, "Non-Volatile Memory and Method with Reduced Source Line Bias Errors,"; (2) U.S. Pat. No. 7,023,736, "Non-Volatile Memory and Method with Improved Sensing,"; (3) U.S. Pat. No. 7,046,568, "Memory Sensing Circuit and Method for Low Voltage Operation"; (4) U.S. Pat. No. 7,196,928, "Compensating for Coupling during Read Operations of Non-Volatile Memory," and (5) U.S. Pat. No. 7,327,619, "Reference Sense Amplifier for Non-Volatile Memory". All five of the immediately above-listed patent documents are incorporated herein by reference in their entirety.

Figure 5B:
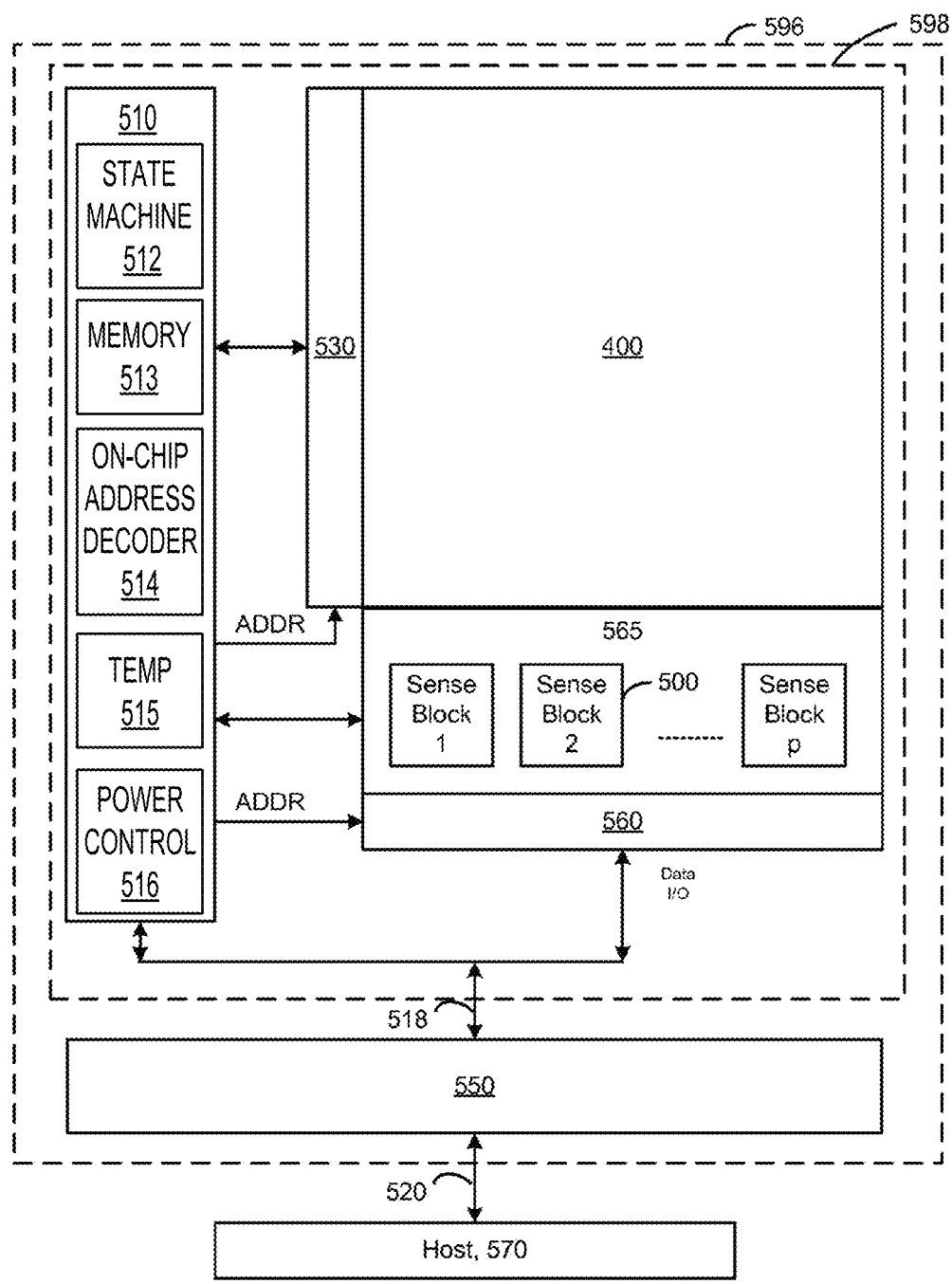
FIG. 5B is a block diagram of a non-volatile memory system which includes the array 400 of FIG. 4 according to aspects of the disclosure.

FIG. 5B is a block diagram of a non-volatile memory system which includes the array 400 of FIG. 4. The memory array 400 could include a 2D architecture or a 3D architecture. One example of a 3D architecture is a BiCS architecture. A 3D architecture may include 3D vertical NAND strings. The memory cells in 3D vertical NAND strings may include an ONO layer to store information. The information may be stored in a charge trapping layer such as, but not limited to, SiN. Note that an ONO layer can be used to store information for both 2D and 2D NAND, as well as other architectures. Thus, a floating gate may be used to store information, but is not required.

The non-volatile memory system comprises a memory device 596 having read/write circuits for reading and programming a page of memory cells in parallel, according to one embodiment of the present technology. Memory device 596 may include one or more memory die 598. Memory die 598 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 and allow a page of memory cells to be read or programmed in parallel. Typically a controller 550 is included in the same memory device 596 (e.g., a removable storage card) as the one or more memory die 598. Commands and Data are transferred between the host 570 and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, a memory 513, an on-chip address decoder 514, a temperature measuring circuit 515 and a power control module 516. The state machine 512 provides chip-level control of memory operations. The memory 513 can store original write data, modified write data and status bits for use by the state machine 512. The on-chip address decoder 514 provides an address interface between that used by the host or a memory controller to the hardware address used by the decoders 530 and 560. The temperature measuring circuit 515 can be used to periodically record ambient temperatures of the memory device 596 to provide a temperature history that can also, for example be stored in memory 513. An example implementation uses a band gap current which is sensitive to temperature. The power control module 516 controls the power and voltages supplied to the word lines and bit lines during memory operations. In another approach, dual row/column decoders and read/write circuits are used. A control circuit can be considered to comprise one or more of the components 510, 512, 513, 514, 515, 516, 530, 550, 560, 565, for instance.

Figure 6A:
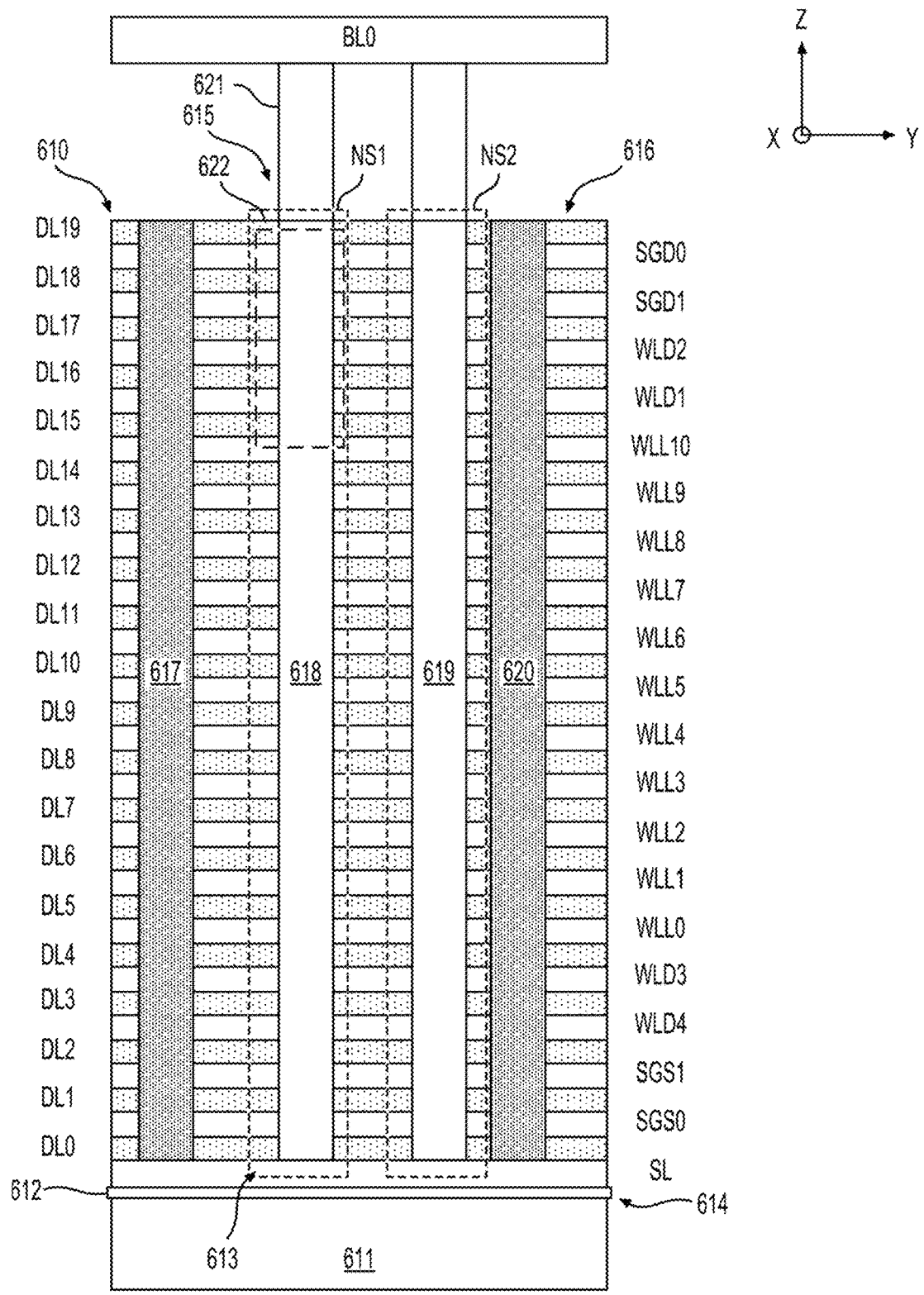
FIG. 6A depicts an example cross-sectional view of a portion of one of the blocks of FIG. 4 according to aspects of the disclosure.

FIG. 6A depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines.

The stack 610 includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

Figure 6B:
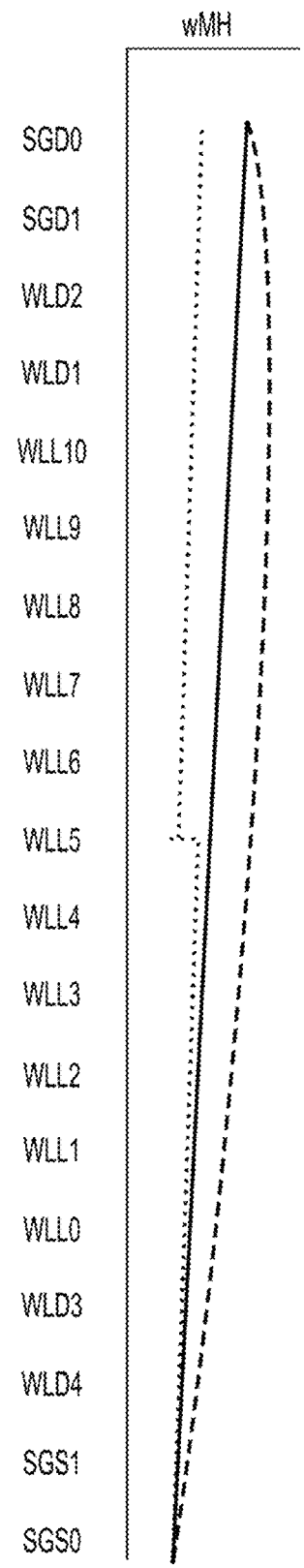
FIG. 6B depicts a plot of memory hole diameter in the stack of FIG. 6A according to aspects of the disclosure.

FIG. 6B depicts a plot of memory hole/pillar diameter in the stack of FIG. 6A. The vertical axis is aligned with the stack of FIG. 6A and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 6B). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes.

Figure 9B:
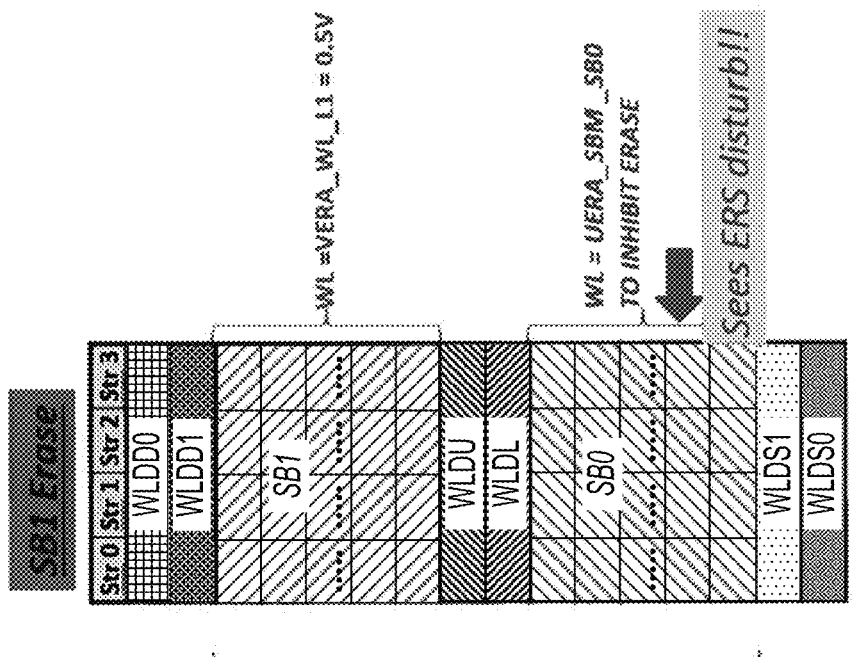
FIGS. 9A-9B show an arrangement of sub-blocks of a block can lead to erase disturb in one sub-block that is inhibited from erasing during while erasing another sub-block according to aspects of the disclosure.
Figure 9A:
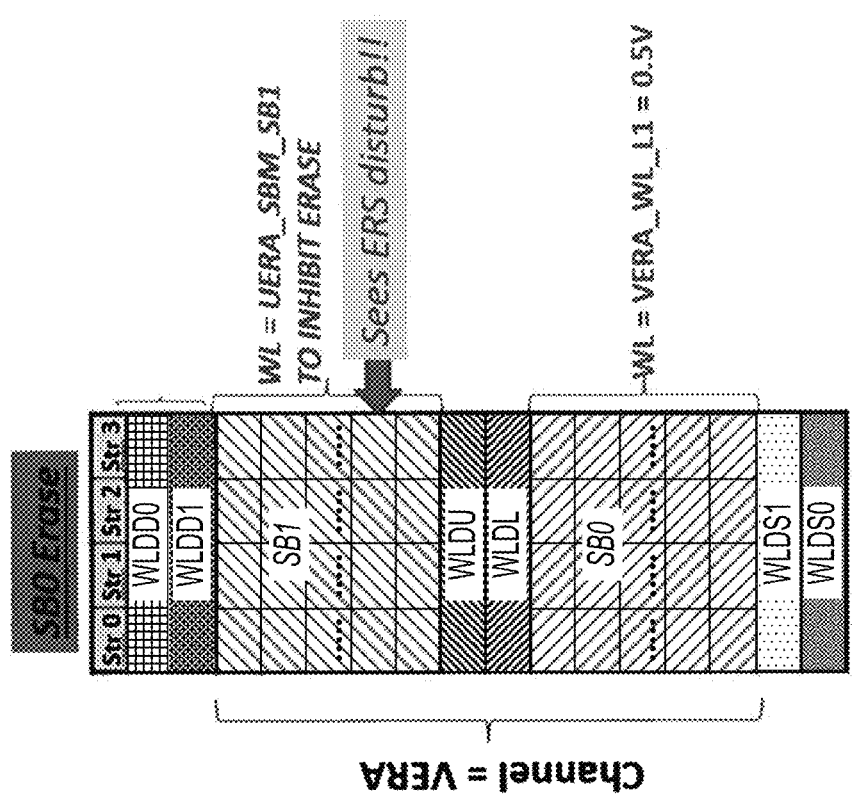

In another possible implementation, represented by the short dashed line, the stack is fabricated in two tiers (also shown in FIGS. 9A and 9B). The lower or bottom tier is formed first with a respective memory hole. The top or upper tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 7A:
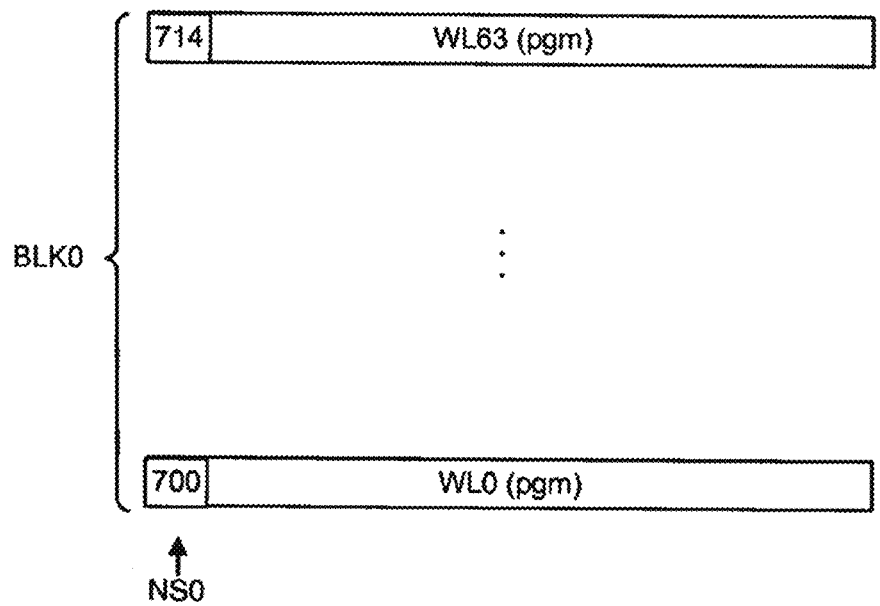
FIG. 7A depicts an example of a fully programmed block BLK0 according to aspects of the disclosure.

FIG. 7A depicts an example of a fully programmed block BLK0. In this example, the block BLK0 (corresponding to FIGS. 3 and 4) has 64 word lines (WL0-WL63) and they are each programmed. A programmed word line can be defined as, e.g., a word line for which at least a specified number of storage elements are in a programmed state. An example NAND string NS0 includes one storage element for each word line, including storage elements 700, . . . , 714 in WL0, . . . , WL63, respectively.

Figure 7B:
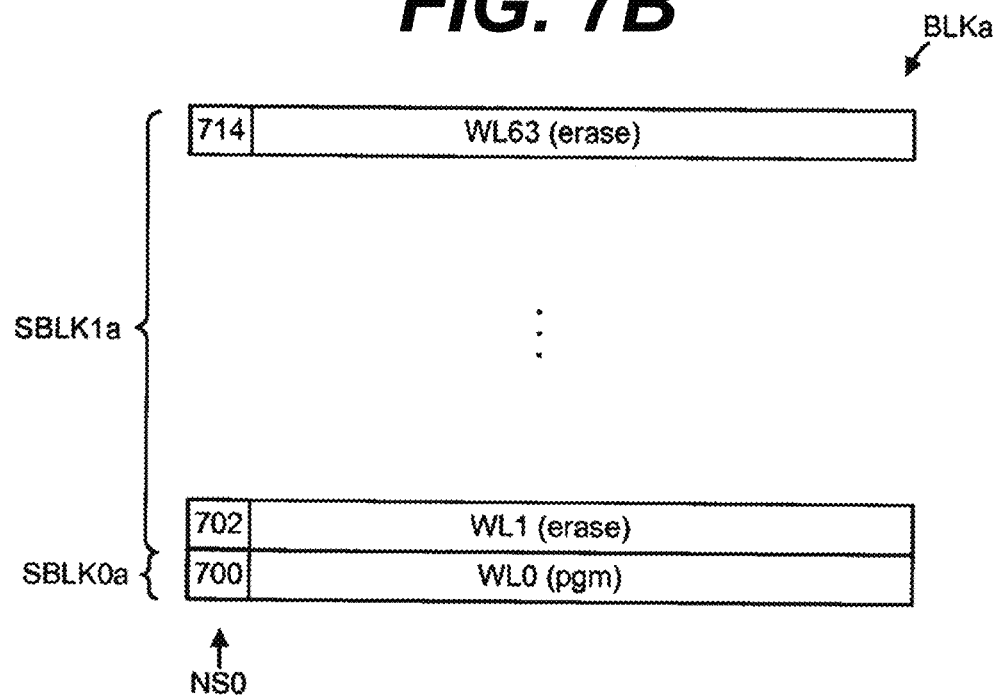
FIG. 7B depicts an example of a partially programmed block BLKa with a programmed source side adjacent sub-block SBLK0a and an erased non-source side adjacent sub-block SBLK1a according to aspects of the disclosure.

FIG. 7B depicts an example of a partially programmed block BLKa with a programmed source side adjacent sub-block SBLK0a and an erased non-source side adjacent sub-block SBLK1a. A sub-block can be a proper subset of a block. A sub-block can thus comprise a subset of a plurality of word lines of a block. In one approach, a sub-block includes contiguous (adjacent) word lines. In another approach, a sub-block includes non-contiguous (non-adjacent) word lines. For example, the sub-block can include odd-numbered but not even-numbered word lines, or even-numbered but not odd numbered word lines. A source side adjacent sub-block can be a sub-block which is adjacent to the source side SS (FIG. 3) of a block, e.g., the sub-block can extend from WL0 to a word line which is between the source side and the drain side (DS, FIG. 3) of a block. Or, the source side adjacent sub-block can include only WL0, for instance, as depicted in FIG. 7B. In this example, a programmed sub-block SBLK0a includes WL0 as a programmed word line, and an erased sub-block SBLK1a includes WL1-WL63 as erased word lines. In general, the block that is partially programmed has some but not all of the word lines programmed.

Example storage elements 700, 702, . . . , 714 of NS0 are in WL0, WL1, . . . , WL63, respectively.

The non-source side adjacent subset SBLK1a comprises a non-volatile storage element 714 which is adjacent to the drain side of the block.

Figure 7C:
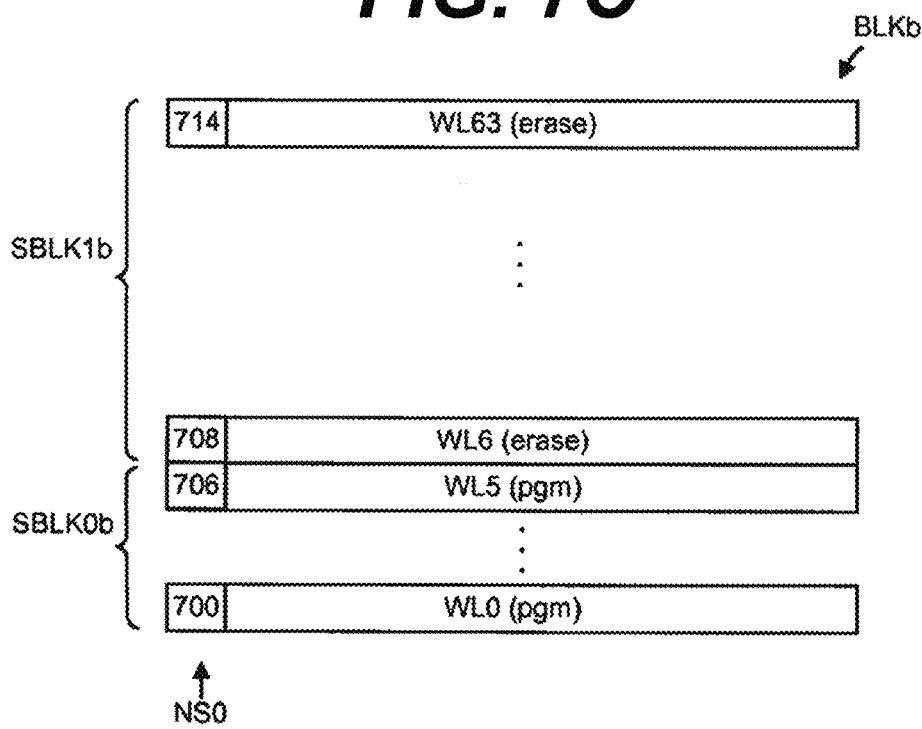
FIG. 7C depicts another example of a partially programmed block BLKb with a programmed source side adjacent sub-block SBLK0b and an erased non-source side adjacent sub-block SBLK1b according to aspects of the disclosure.

FIG. 7C depicts another example of a partially programmed block BLKb with a programmed source side adjacent sub-block SBLK0b and an erased non-source side adjacent sub-block SBLK1b. In this example, SBLK0b includes WL0-WL5 as programmed word lines, and SBLK1b includes WL6-WL63 as erased word lines.

Example storage elements 700, . . . , 706, 708, . . . , 714 of a NAND string are in WL0, . . . WL5, WL6, . . . , WL63, respectively.

Figure 7D:
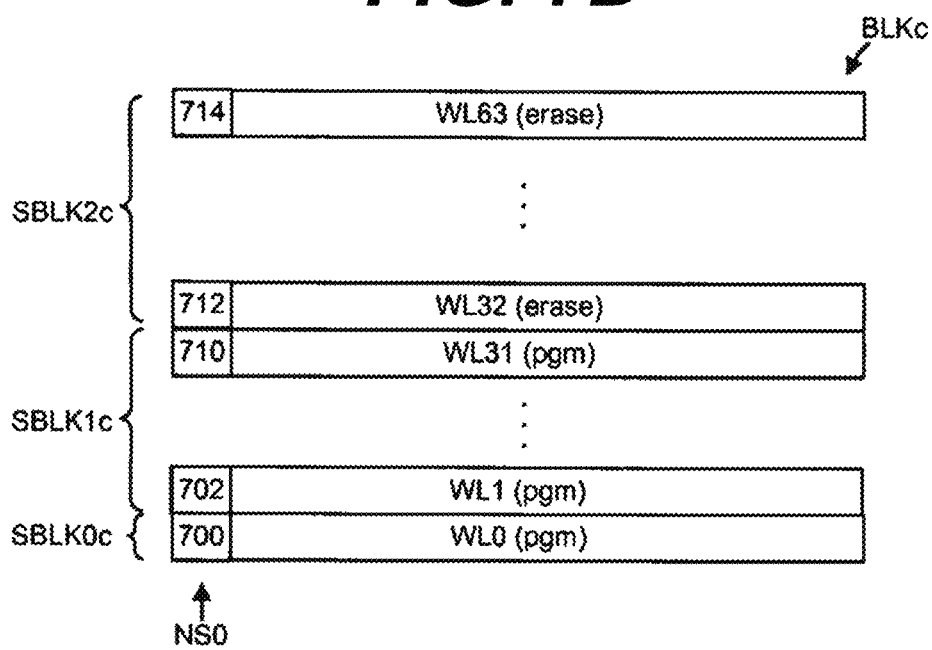
FIG. 7D depicts another example of a partially programmed block BLKc with a programmed source side adjacent sub-block SBLK0c, a programmed non-source side adjacent sub-block SBLK1c, and an erased non-source side adjacent sub-block SBLK2c according to aspects of the disclosure.

FIG. 7D depicts another example of a partially programmed block BLKc with a programmed source side adjacent sub-block SBLK0c, a programmed non-source side adjacent sub-block SBLK1c, and an erased non-source side adjacent sub-block SBLK2c.

In this example, a first programmed sub-block (which is a source side adjacent sub-block) SBLK0c includes WL0 as a programmed word line, a second programmed sub-block (which is a not a source side adjacent sub-block) SBLK1c includes WL1-WL31 as programmed word lines, and an erased drain side adjacent sub-block (which is a not a source side adjacent sub-block) SBLK2c includes WL32-WL63 as erased word lines. SBLK1c is a non-source side adjacent sub-block and a non-drain side adjacent sub-block. SBLK1c is thus intermediate to a source side adjacent sub-block and a drain side adjacent sub-block. A drain side adjacent sub-block can be a sub-block which is adjacent to the drain side DS (FIG. 3) of a block, e.g., the sub-block can extend from WL63 to a word line which is between the source side and the drain side of a block, or the drain side adjacent sub-block can include only WL63 (or other drain side edge word line), for instance.

Example storage elements 700, 702 . . . , 710, 712, . . . , 714 of a NAND string are in WL0, WL1, . . . WL31, WL32, . . . , WL63, respectively.

While each of the examples in FIGS. 7A-7D show programmed sub-blocks on the source-side and erased sub-block on drain side, it should be appreciated that during sub-block operation there is no such constraint. Any sub-block may be independently erased and programmed at any point. So, for example, there could be a scenario where the source side adjacent sub-block or word line group is erased and the drain side sub-block (i.e., non-source side adjacent sub-block) is programmed.

Figure 8A:
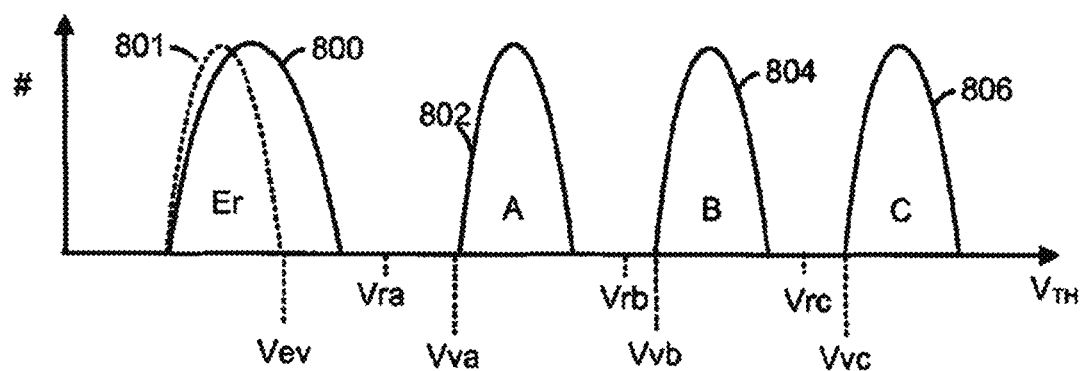
FIG. 8A illustrates exemplary threshold voltage distributions for a memory cell array when each memory cell stores two bits of data in four physical states according to aspects of the disclosure.

After a successful program operation, the threshold voltages of the memory cells should be within one or more distributions of threshold voltages for programmed memory cells or within a distribution of threshold voltages for erased memory cells. FIG. 8A illustrates exemplary threshold voltage distributions for a memory cell array when each memory cell stores two bits of data in four physical states. Distribution 800 represents a distribution of threshold voltages of cells that are in an erased state (storing "11"), which may have negative threshold voltage levels. Distribution 802 represents a distribution of threshold voltages of cells that are in a first programmed state ("A"), storing "10." Distribution 804 represents a distribution of threshold voltages of cells that are in a second programmed state ("B), storing "00." Distribution 806 represents a distribution of threshold voltages of cells that are in a third programmed state ("C"), storing "01."

When programming the memory cells, they may be verified using verify reference levels Vva, Vvb, and Vvc, for the A-C states respectively. When reading the memory cells, the read reference level Vra may be used to determine whether memory cells at the A-state distribution or higher. Likewise, Vrb and Vrc are read reference levels for the B- and C-states, respectively.

Note that when memory cells are initially erased, they may be erased using an erase verify level Vev, resulting in an initial erase distribution 801. The later programming of the other states may cause the upper tail of the erase distribution to shift to the right. It is possible for some of the final erase distribution 800 to be above (higher Vth) than the A-state read level.

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Memory cells are erased in one embodiment by raising the p-well to an erase voltage (e.g., 20 volts) and grounding or applying 0 volts to the word lines of a selected block while the source and bit lines are floating. Due to capacitive coupling, the unselected word lines (e.g., those in unselected, not to-be-erased blocks), bit lines, select lines, and common source lines are also raised to a high positive potential (e.g., 20V). A strong electric field is thus applied to the tunnel oxide layers of memory cells of a selected block and the data of the selected memory cells is erased as electrons of the floating gates are emitted to the substrate. Erasing refers to lowering the threshold voltage of a memory cell by transferring electrons out of its charge storage region (e.g., floating gate or charge trapping layer). For devices have a floating gate, as sufficient electrons are transferred from the floating gate to the p-well region, the threshold voltage of a selected cell becomes negative. Once the threshold voltage reaches a predetermined sufficiently low value, the memory cell can be regarded as erased and the erase process deemed completed or successful. Thus, erasing a memory cell refers to lowering the threshold voltage of a memory cell and does not imply complete or successful erasing thereof. Erasing can be performed on the entire memory array, one or more blocks of the array, or another unit of cells. The erase voltage signal Vsense is typically applied as a series of erase voltage pulses, with an erase verification operation being carried out in between each pulse. If the unit of cells being erased is not verified as erased after application of an erase voltage pulse, another erase voltage pulse can be applied to the p-well region. In some embodiments, the peak value of the erase voltage is increased for each subsequent pulse (e.g., in 1V increments from 16V to 20V).

Figure 8B:
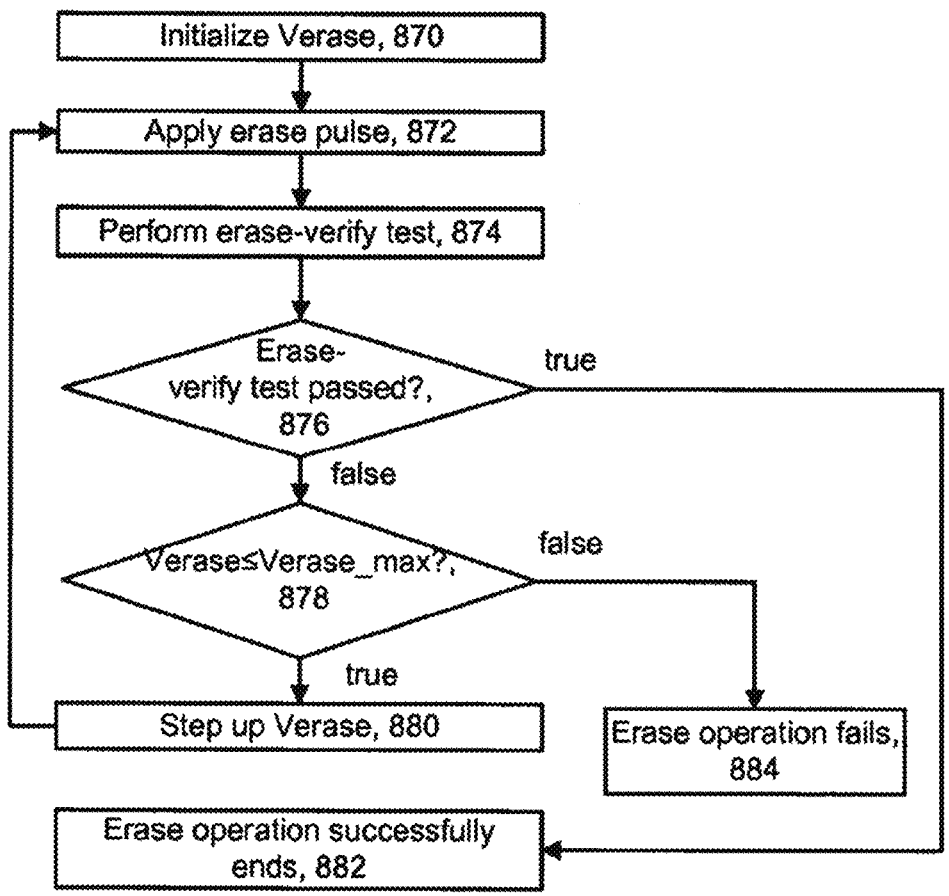
FIG. 8B depicts an example erase operation according to aspects of the disclosure.

FIG. 8B depicts an example erase operation. The steps include: Initialize Verase, 870; Apply erase pulse, 872; Perform erase-verify test, 874; Erase-verify test passed?, 876; Verase≤Verase_max?, 878; Step up Verase, 880; Erase operation successfully ends, 882; and Erase operation fails, 884. In one approach, Verase is the level of a voltage which is applied to the substrate of a block to draw electrons out of the floating gate of a storage element to thereby lower the Vth of the storage element. Performing the erase-verify test can include concurrently applying a voltage Vev to multiple word lines in a block. The erase-verify test can be performed concurrently for storage elements associated with all bit lines, even-numbered bit lines or odd-numbered bit lines.

At decision step 876, the erase-verify test is passed if the sensed storage elements have reached the erased state (e.g., their Vth is below Vev so that the sensed storage elements and their respective NAND strings are in a conductive state).

If decision step 876 is true, the erase operation successfully ends (step 882). If decision step 876 is false, Verase is stepped up and an additional erase pulse is applied, if Verase has not yet reached a maximum level, Verase_max. If decision step 876 is false and Verase has exceeded the maximum level (e.g., decision step 878 is false), the erase operation fails at step 884.

In 2D NAND memory devices, the p-well substrate is biased at a high voltage to erase the storage elements, in one embodiment. Note that the NAND strings are typically formed in the substrate, such that by applying the erase voltage to the substrate while, for example, grounding the control gates, the memory cells can be erased.

One approach to erasing in a 3D stacked non-volatile memory device is to generate gate induced drain leakage (GIDL) current to charge up the channel, raise the channel potential to an erase voltage, and maintain this channel potential during erase. In one approach, the memory device includes NAND strings which have a drain-side select gate (SGD) transistor on one end and a source-side select gate (SGS) transistor on the other end.

Figure 8C:
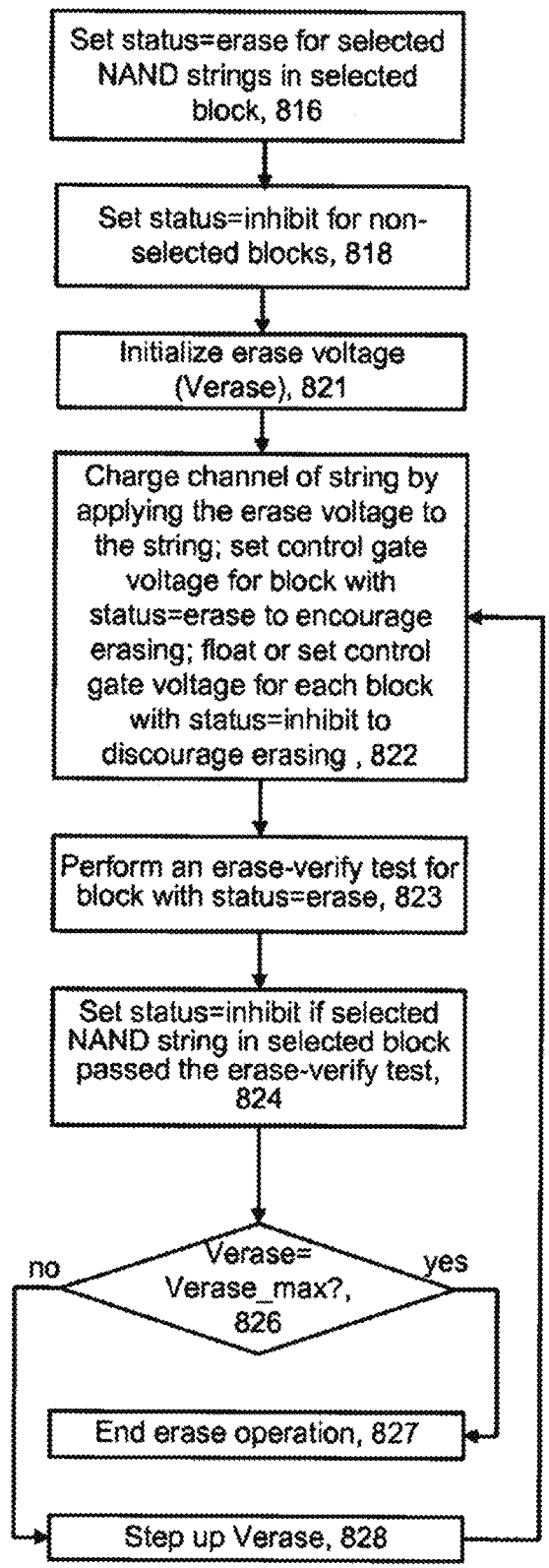
FIG. 8C is a flow chart of a process of performing an erase operation in 3D NAND according to aspects of the disclosure.

FIG. 8C is a flowchart of one embodiment of a process of performing an erase operation in 3D NAND. Generally, an erase operation can include multiple erase-verify iterations which are performed until a verify condition is met, at which point the erase operation ends. Optionally, one or more additional erase voltages can be applied after verify has been passed. In one approach, the memory device includes NAND strings which have a drain-side select gate (SGD) transistor on one end and a source-side select gate (SGS) transistor on the other end (see FIG. 3). The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Step 816 sets status=erase for the storage elements on the selected NAND string that are in the selected block.

Step 818 sets status=inhibit for the storage elements in the unselected blocks.

Step 821 initializes an erase voltage (Verase) to a starting value.

Step 822 charges the channel of the 3D NAND string by applying the erase voltage to the string, setting a control gate voltage for each storage element with status=erase to encourage erasing, and floating or setting a control gate voltage for each storage element with status=inhibit to discourage erasing. For example, a control gate voltage at a relatively high level (e.g., 10-15 V) discourages erasing by creating a small potential difference across the tunneling layer.

A control gate voltage at or slightly above, for example, 0 V encourages erasing by creating a large potential difference across the tunneling layer, between the channel and the control gate, which encourages further tunneling.

Step 823 performs an erase-verify test for storage elements in the selected block (for the selected NAND string). The erase-verify test can be performed concurrently for the different storage elements on the string. For example, this can involve applying a common erase-verify control gate voltage (Vv_erase) to the control gate of each storage element in the selected block while detecting the current through the string.

If the current of the string is above a reference current, indicating the string is conductive, the erase-verify test is passed.

Step 824 sets status=inhibit if the selected NAND string passed the erase-verify test. The erase status=erase is continued if the selected NAND string does not pass the erase-verify test.

Decision step 826 determines if Verase is at Verase max. If the answer is "yes," the erase operation ends unsuccessfully at step 827. If the answer is "no," Verase is stepped up at step 828 and another iteration is performed at step 822.

As previously discussed, when sub-blocks are arranged with contiguous (adjacent) word lines so that the sub-blocks are arranged vertically in a stack (e.g., one or more sub-blocks arranged on top of another sub-block), such as what is described in FIG. 7B above, erasing one sub-block can cause erase disturb in another sub-block that is inhibited from erasing. For example, in FIG. 9A, a first sub-block SB0 associated with a lower tier of the stack (i.e., the first sub-block SB0 is a source side adjacent sub-block) is arranged below a second sub-block SB1 associated with an upper tier of the stack (i.e., the second sub-block SB1 is a drain side adjacent sub-block). During an erase operation of the first sub-block SB0, an erase voltage VERA is applied to the substrate or channel of the block. At the same time, the word lines corresponding with the first sub-block SB0 (selected one of the first and second blocks SB0, SB1) have a word line erase voltage VERA_WL_L1 (e.g., 0.5 volts) applied to them to encourage erasing of the memory cells connected to the word lines corresponding with the first sub-block SB0. Also at the same time, the word lines corresponding with the second sub-block SB1 (unselected one of the first and second blocks SB0, SB1) have a word line inhibit voltage UERA_SBM_SB1 applied to them to discourage erasing of the memory cells connected to the word lines corresponding with the second sub-block SB1. However, during the erase operation, the second sub-block SB1 experiences an erase disturb. Similarly, during an erase operation of the second sub-block SB1 in FIG. 9B, an erase voltage VERA is again applied to the substrate or channel of the block. At the same time, the word lines corresponding with the second sub-block SB1 (selected one of the first and second blocks SB0, SB1) have a word line erase voltage VERA_WL_L1 (e.g., 0.5 volts) applied to them to encourage erasing of the memory cells connected to the word lines corresponding with the second sub-block SB1. Also at the same time, the word lines corresponding with the first sub-block SB0 (unselected one of the first and second blocks SB0, SB1) have a word line inhibit voltage UERA_SBM_SB1 applied to them to discourage erasing of the memory cells connected to the word lines corresponding with the first sub-block SB0. Like the second sub-block SB1 in FIG. 9A, the first sub-block SB0 in FIG. 9B experiences an erase disturb during the erase operation in which the second sub-block SB1 is erased.

Referring to FIG. 10A, when the erase operation is a "two-sided erase", the gate-induced drain leakage (GIDL) based hole generation is blocked both for the case in which the first sub-block SB0 is being erased and the second sub-block SB1 is inhibited from erasing and the case in which the second sub-block SB1 is being erased and the first sub-block SB0 is strongly inhibited from erasing (i.e., the word line inhibit voltage UERA_SBM_SB1 applied on the word lines corresponding with the first sub-block SB0 is a higher relative voltage, or closer to the erase voltage). As shown in FIG. 10B, hole generation necessary to erase the first sub-block SB0 is not blocked by strong inhibiting of the second sub-block SB1 when the erase operation is a source side erase operation and the first sub-block SB0 is a source side adjacent sub-block. Yet, hole generation necessary to erase the second sub-block SB1 is blocked by strong inhibiting of the first sub-block SB0 when the erase operation is a source side erase operation and the second sub-block SB1 is a drain side adjacent sub-block. Similarly, as shown in FIG. 10C, hole generation necessary to erase the second sub-block SB1 is not blocked by strong inhibiting of the first sub-block SB0 when the erase operation is a drain side erase operation and the second sub-block SB1 is a drain side adjacent sub-block. However, hole generation necessary to erase the first sub-block SB0 is blocked by strong inhibiting of the second sub-block SB1 when the erase operation is a drain side erase operation and the first sub-block SB0 is a source side adjacent sub-block. In other words, there are scenarios (those shown in FIGS. 10A-10C surrounded by dashed lines) in which the inhibited sub-block is in the path of hole transport.

Consequently, as best shown in FIG. 11, when the inhibited or unselected sub-blocks are strongly inhibited (i.e., the word line inhibit voltage UERA_SBM_SB1 applied on the word lines corresponding with the first sub-block SB0 is a relatively higher voltage), the erase speed of the selected sub-block (the one being erased) is reduced, while there is less erase disturb on the unselected or inhibited sub-block. In contrast, still referring to FIG. 11, when the inhibited or unselected sub-blocks are weakly inhibited (i.e., the word line inhibit voltage UERA_SBM_SB1 applied on the word lines corresponding with the first sub-block SB0 is a lower relative voltage), the erase speed of the selected sub-block (the one being erased) is improved, while there is more or worse erase disturb on the unselected or inhibited sub-block. Thus, there is a need to find an optimum word line inhibit voltage to reduce erase disturb of the unselected or inhibited sub-block while not degrading the erase speed of the selected sub-block.

FIG. 12 shows erase disturb of the unselected sub-block during a two-sided erase operation at both a high temperature (HT) and a low temperature (LT). More specifically, the word line inhibit voltage used is the erase voltage VERA minus 6.8 volts and threshold voltage Vt distributions of the memory cells of the first sub-block SB0 (shown in the lower portion of FIG. 12) and the threshold voltage Vt distributions of the memory cells of the second sub-block SB1 (shown in the upper portion of FIG. 12) are shown at both the high temperature (e.g., 85 degrees Celsius) and a low temperature (e.g., -30 degrees Celsius). As shown, at the high temperature, the program state of memory cells in the first sub-block SB0 shift toward the erase state (i.e., experience erase disturb) as the second sub-block SB1 experiences an increasing number of erase operation cycles. Yet, at the low temperature, the program state of memory cells in the first sub-block SB0 do not appreciably shift as the second sub-block SB1 experiences an increasing number of erase operation cycles. So, even a weaker inhibit bias (e.g., word line inhibit voltage used is the erase voltage VERA minus 6.8 volts) applied to the word lines associated with the first sub-block SB0 causes a significant erase disturb on the first sub-block SB0 at the high temperature. From these results, it can be concluded that the erase disturb is strongly temperature dependent and the erase disturb experienced by the inhibited or unselected sub-block (e.g., the first sub-block SB0) is worse at high temperature than at low temperature.

FIGS. 13A and 13B show comparisons of the erase upper tail (i.e., the portion of the threshold voltage Vt distribution of the memory cells of the sub-block in the erased state with a relatively higher threshold voltage) to demonstrate the erase speed of the selected sub-block (e.g., the first sub-block SB1) during a two-sided erase (FIG. 13A) and a source side erase operation (FIG. 13B) at both the high temperature and the low temperature. More specifically, the average threshold voltage Vt of the memory cells of the selected sub-block after the erase operation is plotted versus various erase voltages VERA while no word line inhibit voltage is used (i.e., no inhibiting) for the unselected sub-block, the word line inhibit voltage used equals the erase voltage VERA for the unselected sub-block, and the word line inhibit voltage used is the erase voltage VERA minus 6.8 volts for the unselected sub-block. The average threshold voltage Vt of the memory cells of the selected sub-block after the erase operation are shown on the left hand side of FIGS. 13A and 13B for the high temperature (e.g., 85 degrees Celsius) and on the right hand side of FIGS. 13A and 13B for the low temperature (e.g., −30 degrees Celsius). As shown, there is no appreciable change in the average threshold voltage Vt of the memory cells of the selected sub-block after the erase operation for each of the word line inhibit voltages (no inhibiting, the word line inhibit voltage=VERA, and the word line inhibit voltage=VERA− 6.8 v) for the two-sided erase (FIG. 13A) and the source side erase operation (FIG. 13B) at the high temperature. In contrast, there is an appreciable change in the average threshold voltage Vt of the memory cells of the selected sub-block after the erase operation when the word line inhibit voltage=VERA as compared to no inhibiting or the word line inhibit voltage=VERA−6.8 v. In more detail, the average threshold voltage Vt of the memory cells of the selected sub-block after the erase operation is higher for both the two-sided erase (FIG. 13A) and the source side erase operation (FIG. 13B) at the low temperature as compared to no inhibiting of the unselected sub-block or the word line inhibit voltage of the unselected sub-block=VERA−6.8 v. Such an increase of the average threshold voltage Vt of the memory cells of the selected sub-block after the erase operation indicates that the erase speed is slower. So, for the two-sided erase operation, for example, the erase of the second sub-block SB1 slows down when the first sub-block SB0 word lines are strongly inhibited (word line inhibit voltage=VERA); however, when the first sub-block SB0 word lines are more weakly inhibited (word line inhibit voltage=VERA−6.8v), the erase speed of the second sub-block SB1 is comparable to a full block erase speed (e.g., the whole block including both the first sub-block SB0 and the second sub-block SB1). Therefore, a strong inhibiting (e.g., word line inhibit voltage=VERA) of the unselected sub-block significantly impacts erase speed only at the low temperature.

Consequently, an improved memory apparatus (e.g., memory device 596 in FIG. 5B) including a block (e.g., BLK0 in FIG. 3) having storage elements or memory cells (e.g., storage elements 301, . . . , 302-306, . . . , 307 in FIG. 3) connected to word lines (e.g., WL0-WL63 in FIG. 3) and arranged in strings (e.g., strings NS0, NS1, . . . , NSn-1 in FIG. 3) is provided. The block is divided into the first sub-block SB0 and the second sub-block SB1 (see e.g., FIGS. 9A-9B) each configured to be erased as a whole in an erase operation. The apparatus also includes the temperature measuring circuit 515 (FIG. 5B) that is configured to detect an ambient temperature of the apparatus. In addition the apparatus includes a control circuit (e.g., components 510, 512, 513, 514, 515, 516, 530, 550, 560, 565) coupled to the word lines and the strings and the temperature measuring circuit 515. The control circuit is configured to determine a word line inhibit voltage based on the ambient temperature. The control circuit is also configured to apply an erase voltage to each of the strings while simultaneously applying a word line erase voltage to the word lines associated with a selected one of the first and second sub-blocks SB0, SB1 to encourage erasing of the memory cells and the word line inhibit voltage to the word lines associated with an unselected one of the first and second sub-blocks SB0, SB1 to discourage erasing of the memory cells in the erase operation. In more detail, the word line inhibit voltage is selected based on the ambient temperature to both minimize an erase disturb effect experienced by the memory cells of the unselected one of the first and second sub-blocks and optimize a speed of the erase operation of the memory cells of the selected one of the first and second sub-blocks SB0, SB1. According to an aspect, the word line erase voltage is approximately 0.5 volts and the erase voltage is within a range of approximately 16 to approximately 22 volts. While the apparatus is discussed as including only two sub-blocks SB0, SB1, it should be appreciated that the apparatus may instead include more than two sub-blocks (i.e., the operation of the apparatus and method discussed herein can be extended to 'n' number of sub-blocks).

Referring back to FIGS. 6A and 6B and as discussed above, the word lines overlay one another in a stack and each of the strings comprises a memory hole extending vertically through the stack. The memory hole has a plurality of tiers including a lower tier and an upper tier vertically aligned with one another in the stack. Thus, according to an aspect, the lower tier comprises the first sub-block SB0 of the memory cells and the upper tier comprises the second sub-block SB1 of the memory cells. Nevertheless, other arrangements of the word lines and tiers are contemplated, including stacks with more than two tiers.

As discussed above, the erase operation can be a "one-sided erase" or a "two-sided erase". Therefore, the erase operation can be selected from the group consisting of a two-sided erase operation, a source side erase operation, and a drain side erase operation. Again, each of the strings is coupled to a bit line on a drain side of each of the strings and a source line on a source side of each of the strings (e.g., source line SL of FIG. 6A). Consequently, the control circuit is further configured to apply the erase voltage to the bit line of each of the strings associated with the selected one of the first sub-block SB0 and the second sub-block SB1 during the drain side erase operation. The control circuit is also configured to apply the erase voltage to the source line of each of the strings associated with the selected one of the first sub-block SB0 and the second sub-block SB1 during the source side erase operation. For example, when the erase voltage is applied to the source line, GIDL based hole generation is initiated under the SGS region and holes will be transported into the channel and bring up the channel potential to the erase voltage level. In addition, the control circuit is configured to apply the erase voltage to both the bit line and the source line of each of the strings associated with the selected one of the first sub-block SB0 and the second sub-block SB1 during the two-sided erase operation. In each type of erase operation, it is advantageous for the word line inhibit voltage to be selected based on the ambient temperature to both minimize an erase disturb effect experienced by the memory cells of the unselected one of the first and second sub-blocks and optimize a speed of the erase operation of the memory cells of the selected one of the first and second sub-blocks.

Accordingly, the control circuit is further configured to utilize a first word line inhibit voltage as the word line inhibit voltage in response to the temperature measuring circuit detecting the ambient temperature being a high temperature (e.g., 85 degrees Celsius). The control circuit is also configured to utilize a second word line inhibit voltage as the word line inhibit voltage in response to the temperature measuring circuit detecting the ambient temperature being a low temperature (e.g., −30 degrees Celsius) less than the high temperature. According to an aspect, the second word line inhibit voltage is less than the first word line inhibit voltage. So, for instance, by applying a stronger or higher word line inhibit voltage (e.g., VERA) on the unselected sub-block at the high temperature (e.g., 85 degrees Celsius), the erase disturb on the unselected sub-block is thereby reduced without an erase speed degradation. Also, by applying a weaker or lower word line inhibit voltage (e.g., VERA-6.8 volts) on the unselected sub-block at the low temperature (e.g., −30 degrees Celsius), the erase speed degradation on the unselected sub-block is thereby eliminated, at the same time there is only a negligible erase disturb on the unselected sub-block.

FIG. 14A shows a plot of the word line inhibit voltage at various temperatures for negligible erase disturb for an example memory apparatus. As best shown in FIG. 14B, the apparatus can also include a table 1400 stored in the memory cells. The table 1400 is configured to store one or more factors used by the control circuit to determine the word line inhibit voltage based on the ambient temperature. The rightmost column of the table of FIG. 14B defines a slope of the plot/line shown in FIG. 14A. Such a slope could, for example, be chosen before manufacturing the memory apparatus (no slope or a slope of zero would indicate that any temperature compensation of the word line inhibit voltage is disabled).

Referring now to FIG. 15, a method of operating a memory apparatus is also provided. As above, the memory apparatus includes a block having memory cells connected to word lines and arranged in strings. The block is divided into a first sub-block SB0 and a second sub-block SB1 each configured to be erased as a whole in an erase operation. The memory apparatus includes the temperature measuring circuit 515 configured to detect an ambient temperature of the memory apparatus. Thus, the method includes the step of 1500 determining a word line inhibit voltage based on the ambient temperature. The method continues with the step of 1502 applying an erase voltage to each of the strings while simultaneously applying a word line erase voltage to the word lines associated with a selected one of the first and second sub-blocks SB0, SB1 to encourage erasing of the memory cells and the word line inhibit voltage to the word lines associated with an unselected one of the first and second sub-blocks SB0, SB1 to discourage erasing of the memory cells in the erase operation. Again, the word line inhibit voltage is selected to both minimize an erase disturb effect experienced by the memory cells of the unselected one of the first and second sub-blocks SB0, SB1 and optimize a speed of the erase operation of the memory cells of the selected one of the first and second sub-blocks SB0, SB1.

As discussed, the word lines of the memory apparatus can overlay one another in a stack and each of the strings comprises a memory hole extending vertically through the stack. Each of the strings can also have a plurality of tiers including a lower tier and an upper tier vertically aligned with one another in the stack. The lower tier can comprises the first sub-block SB0 of the memory cells and the upper tier can comprise the second sub-block SB1 of the memory cells, for example. Also, the erase operation can be selected from the group consisting of a two-sided erase operation, a source side erase operation, and a drain side erase operation and each of the strings is coupled to a bit line on a drain side of each the strings and a source line on a source side of each the strings. So, the method further includes the steps of applying the erase voltage to the bit line of each of the strings associated with the selected one of the first sub-block SB0 and the second sub-block SB1 during the drain side erase operation. The method can also include the step of applying the erase voltage to the source line of each of the strings associated with the selected one of the first sub-block SB0 and the second sub-block SB1 during the source side erase operation. Additionally, the method can include the step of applying the erase voltage to both the bit line and the source line of each of the strings associated with the selected one of the first sub-block SB0 and the second sub-block SB1 during the two-sided erase operation.

The method can further include the step of utilizing a first word line inhibit voltage as the word line inhibit voltage in response to the temperature measuring circuit 515 detecting the ambient temperature being a high temperature (e.g., 85 degrees Celsius). In addition, the method can include the step of utilizing a second word line inhibit voltage as the word line inhibit voltage in response to the temperature measuring circuit 515 detecting the ambient temperature being a low temperature (e.g., −30 degrees Celsius) less than the high temperature. The second word line inhibit voltage can be less than the first word line inhibit voltage. As discussed above, a table (FIG. 14B) can be stored in the memory cells. The table can be configured to store one or more factors used to determine the word line inhibit voltage based on the ambient temperature.

FIG. 16 shows simulated results of the memory apparatus in which the word line inhibit voltage is selected based on the ambient temperature. Specifically, significantly less erase disturb is experienced by the unselected sub-block during the erase operation at both the high temperature (e.g., 85 degrees Celsius) and the low temperature (e.g., −30 degrees Celsius). The first sub-block SB0 is shown inhibited using the word line inhibit voltage being the erase voltage VERA or the erase voltage VERA minus 6.8 volts on the left hand side of FIG. 16 (i.e., SB0 victim). Similarly, the second sub-block SB1 is shown inhibited using the word line inhibit voltage being the erase voltage VERA or the erase voltage VERA minus 6.8 volts on the right hand side of FIG. 16 (i.e., SB1 victim). The threshold voltage Vt distributions of the memory cells of the first sub-block SB0 (shown in the lower portion of FIG. 16) and the threshold voltage Vt distributions of the memory cells of the second sub-block SB1 (shown in the upper portion of FIG. 16) confirm that using an inhibit bias or word line inhibit voltage based on the ambient temperature can achieve negligible erase disturb. Thus, the memory apparatus and method described herein both minimize an erase disturb effect experienced by the memory cells of the unselected one of the first and second sub-blocks SB0, SB1 and optimize a speed of the erase operation of the memory cells of the selected one of the first and second sub-blocks SB0, SB1.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
   a block including memory cells connected to word lines and arranged in strings, the block being divided into a first sub-block and a second sub-block each configured to be erased as a whole in an erase operation;
   the word lines overlaying one another in a stack and each of the strings comprising a memory hole extending vertically through the stack and having a plurality of tiers including a lower tier and an upper tier vertically aligned with one another in the stack and the lower tier comprising the first sub-block of the memory cells and the upper tier comprising the second sub-block of the memory cells;
   the erase operation being selected from the group consisting of a two-sided erase operation, a source side erase operation, and a drain side erase operation and each of the strings being coupled to a bit line on a drain side of each of the strings and a source line on a source side of each of the strings;
   a temperature measuring circuit configured to detect an ambient temperature of the apparatus; and
   a control circuit coupled to the word lines and the strings and the temperature measuring circuit and configured to:
     determine a word line inhibit voltage based on the ambient temperature,
     apply an erase voltage to each of the strings while simultaneously applying a word line erase voltage to the word lines associated with a selected one of the first and second sub-blocks to encourage erasing of the memory cells and the word line inhibit voltage to the word lines associated with an unselected one of the first and second sub-blocks to discourage erasing of the memory cells in the erase operation,
     apply the erase voltage to the bit line of each of the strings associated with the selected one of the first sub-block and the second sub-block during the drain side erase operation,
     apply the erase voltage to the source line of each of the strings associated with the selected one of the first sub-block and the second sub-block during the source side erase operation, and
     apply the erase voltage to both the bit line and the source line of each of the strings associated with the selected one of the first sub-block and the second sub-block during the two-sided erase operation.

2. The apparatus as set forth in claim 1, wherein the control circuit is further configured to:
   utilize a first word line inhibit voltage as the word line inhibit voltage in response to the temperature measuring circuit detecting the ambient temperature being a high temperature, and
   utilize a second word line inhibit voltage as the word line inhibit voltage in response to the temperature measuring circuit detecting the ambient temperature being a low temperature less than the high temperature, wherein the second word line inhibit voltage is less than the first word line inhibit voltage.

3. The apparatus as set forth in claim 1, further including a table stored in the memory cells configured to store one or more factors used by the control circuit to determine the word line inhibit voltage based on the ambient temperature.

4. The apparatus as set forth in claim 1, wherein the word line inhibit voltage is selected to both minimize an erase disturb effect experienced by the memory cells of the unselected one of the first and second sub-blocks and optimize a speed of the erase operation of the memory cells of the selected one of the first and second sub-blocks.

5. The apparatus as set forth in claim 1, wherein the word line erase voltage is approximately 0.5 volts and the erase voltage is within a range of approximately 16 to approximately 22 volts.

6. A controller in communication with a memory apparatus including a block including memory cells connected to word lines and arranged in strings, the block being divided into a first sub-block and a second sub-block each configured to be erased as a whole in an erase operation, the controller being in communication with a temperature measuring circuit configured to detect an ambient temperature of the memory apparatus, the word lines of the memory apparatus overlay one another in a stact and each of the strings comprises a memory hole extending vertically through the stack and having a plurality of tiers including a lower tier and an upper tier vertically aligned with one another in the stack and the lower tier comprises the first sub-block of the memory cells and the upper tier comprises the second sub-block of the memory cells, the erase operation being selected from the group consisting of a two-sided erase operation, a source side erase operation, and a drain side erase operation and each of the strings is coupled to a bit line on a drain side of each the strings and a source line on a source side of each the strings, the controller configured to:
  determine a word line inhibit voltage based on the ambient temperature;
  instruct the memory apparatus to apply an erase voltage to each of the strings while simultaneously applying a word line erase voltage to the word lines associated with a selected one of the first and second sub-blocks to encourage erasing of the memory cells and the word line inhibit voltage to the word lines associated with an unselected one of the first and second sub-blocks to discourage erasing of the memory cells in the erase operation;
  instruct the memory apparatus to apply the erase voltage to the bit line of each of the strings associated with the selected one of the first sub-block and the second sub-block during the drain side erase operation;
  instruct the memory apparatus to apply the erase voltage to the source line of each of the strings associated with the selected one of the first sub-block and the second sub-block during the source side erase operation; and
  instruct the memory apparatus to apply the erase voltage to both the bit line and the source line of each of the strings associated with the selected one of the first sub-block and the second sub-block during the two-sided erase operation.

7. The controller as set forth in claim 6, wherein the controller is further configured to:
  utilize a first word line inhibit voltage as the word line inhibit voltage in response to the temperature measuring circuit detecting the ambient temperature being a high temperature; and
  utilize a second word line inhibit voltage as the word line inhibit voltage in response to the temperature measuring circuit detecting the ambient temperature being a low temperature less than the high temperature, wherein the second word line inhibit voltage is less than the first word line inhibit voltage.

8. The controller as set forth in claim 6, wherein the memory apparatus further includes a table stored in the memory cells configured to store one or more factors used by the controller to determine the word line inhibit voltage based on the ambient temperature.

9. The controller as set forth in claim 6, wherein the word line inhibit voltage is selected to both minimize an erase disturb effect experienced by the memory cells of the unselected one of the first and second sub-blocks and optimize a speed of the erase operation of the memory cells of the selected one of the first and second sub-blocks.

10. The controller as set forth in claim 6, wherein the word line erase voltage is approximately 0.5 volts and the erase voltage is within a range of approximately 16 to approximately 22 volts.

11. A method of operating a memory apparatus including a block including memory cells connected to word lines and arranged in strings, the block being divided into a first sub-block and a second sub-block each configured to be erased as a whole in an erase operation, the memory apparatus including a temperature measuring circuit configured to detect an ambient temperature of the memory apparatus, the word lines of the memory apparatus overlay one another in a stack and each of the strings comprises a memory hole extending vertically through the stack and having a plurality of tiers including a lower tier and an upper tier vertically aligned with one another in the stack and the lower tier comprises the first sub-block of the memory cells and the upper tier comprises the second sub-block of the memory cells, and the erase operation is selected from the group consisting of a two-sided erase operation, a source side erase operation, and a drain side erase operation and each of the strings is coupled to a bit line on a drain side of each the strings and a source line on a source side of each the strings, the method comprising the steps of:
  determining a word line inhibit voltage based on the ambient temperature;
  applying an erase voltage to each of the strings while simultaneously applying a word line erase voltage to the word lines associated with a selected one of the first and second sub-blocks to encourage erasing of the memory cells and the word line inhibit voltage to the word lines associated with an unselected one of the first and second sub-blocks to discourage erasing of the memory cells in the erase operation;
  applying the erase voltage to the bit line of each of the strings associated with the selected one of the first sub-block and the second sub-block during the drain side erase operation;
  applying the erase voltage to the source line of each of the strings associated with the selected one of the first sub-block and the second sub-block during the source side erase operation; and
  applying the erase voltage to both the bit line and the source line of each of the strings associated with the selected one of the first sub-block and the second sub-block during the two-sided erase operation.

12. The method as set forth in claim 11, wherein the method further includes the steps of:
  utilizing a first word line inhibit voltage as the word line inhibit voltage in response to the temperature measuring circuit detecting the ambient temperature being a high temperature; and
  utilizing a second word line inhibit voltage as the word line inhibit voltage in response to the temperature measuring circuit detecting the ambient temperature being a low temperature less than the high temperature, wherein the second word line inhibit voltage is less than the first word line inhibit voltage.

13. The method as set forth in claim 11, further including a table stored in the memory cells configured to store one or more factors used to determine the word line inhibit voltage based on the ambient temperature.

14. The method as set forth in claim 11, wherein the word line inhibit voltage is selected to both minimize an erase disturb effect experienced by the memory cells of the unselected one of the first and second sub-blocks and optimize a speed of the erase operation of the memory cells of the selected one of the first and second sub-blocks.

* * * * *